(12) United States Patent
Akae et al.

(10) Patent No.: US 8,609,551 B2
(45) Date of Patent: Dec. 17, 2013

(54) METHOD FOR MANUFACTURING SEMICONDUCTOR DEVICE AND SUBSTRATE PROCESSING APPARATUS

(75) Inventors: Naonori Akae, Toyama (JP); Yoshiro Hirose, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 37 days.

(21) Appl. No.: 12/318,131

(22) Filed: Dec. 22, 2008

(65) Prior Publication Data
US 2009/0170345 A1 Jul. 2, 2009

(30) Foreign Application Priority Data

Dec. 26, 2007 (JP) ................................ 2007-334251
Jul. 24, 2008 (JP) ................................ 2008-190520
Nov. 5, 2008 (JP) ................................ 2008-283971

(51) Int. Cl.
*H01L 21/31* (2006.01)
*H01L 21/469* (2006.01)
*H01L 21/285* (2006.01)

(52) U.S. Cl.
USPC ........... 438/778; 438/761; 438/787; 438/791; 257/E21.16; 257/E21.267; 257/E21.293; 257/E21.301; 257/E21.302

(58) Field of Classification Search
USPC .......................... 438/758, 761, 787–788, 791
See application file for complete search history.

(56) References Cited

U.S. PATENT DOCUMENTS

| | | | | |
|---|---|---|---|---|
| 5,412,246 | A  * | 5/1995 | Dobuzinsky et al. | 257/632 |
| 6,339,009 | B1 | 1/2002 | Lee et al. | |
| 6,936,548 | B2 * | 8/2005 | Dussarrat et al. | 438/769 |
| 2003/0059535 | A1 | 3/2003 | Luo et al. | |
| 2004/0150031 | A1 * | 8/2004 | Ohmi et al. | 257/314 |
| 2005/0118837 | A1 * | 6/2005 | Todd et al. | 438/791 |
| 2006/0199398 | A1 | 9/2006 | Sugawara et al. | |
| 2006/0273357 | A1 * | 12/2006 | Shimamoto et al. | 257/288 |
| 2007/0010071 | A1 * | 1/2007 | Matsuura | 438/478 |
| 2008/0107824 | A1 | 5/2008 | Hasebe et al. | |
| 2008/0124943 | A1 | 5/2008 | Yuasa et al. | |

FOREIGN PATENT DOCUMENTS

| | | |
|---|---|---|
| JP | A-2001-203339 | 7/2001 |
| JP | A-2004-356528 | 12/2004 |
| JP | A-2006-522225 | 9/2006 |
| JP | A-2007-19145 | 1/2007 |

(Continued)

OTHER PUBLICATIONS

English Translation of Jun. 22, 2010 Office Action issued in Japanese Application No. 2008-283971.

(Continued)

*Primary Examiner* — Calvin Choi
(74) *Attorney, Agent, or Firm* — Oliff & Berridge, PLC

(57) ABSTRACT

To form an insulating film with extremely low concentration of impurities such as carbon, hydrogen, nitrogen, chlorine, etc in a film. There are provided the steps of forming a specific element-containing layer on a substrate by supplying source gas containing a specific element into a processing container in which the substrate is accommodated; changing the specific element-containing layer into a nitride layer, by activating and supplying gas containing nitrogen into the processing container; and changing the nitride layer into an oxide layer or an oxynitride layer, by activating and supplying gas containing oxygen into the processing container; with this cycle set as one cycle and performed for at least one or more times.

24 Claims, 10 Drawing Sheets

(a)

(b)

(c)

(56) References Cited

FOREIGN PATENT DOCUMENTS

| | | |
|---|---|---|
| JP | A-2008-66483 | 3/2008 |
| KR | A-2002-0086638 | 11/2002 |
| KR | 10-2007-0098952 | 10/2007 |
| WO | WO 2004/094691 A1 | 11/2004 |

OTHER PUBLICATIONS

Korean Office Action issued on Sep. 30, 2010 in Korean Patent Application No. 10-2008-0127327. (with translation).

Office Action dated Aug. 24, 2012 issued in Taiwanese Patent Application No. 097148726 (with translation).

Office Action dated Jan. 8, 2013 issued in Japanese Patent Application No. 2010-185811 (with translation).

Office Action dated Dec. 7, 2011 issued in Korean Patent Application No. 10-2010-0120771 (with translation).

Office Action issued Jan. 25, 2011 in Korean Application No. 10-2010-0120771 (w/translation).

Office Action dated Jun. 23, 2011 issued in Korean Patent Application No. 10-2008-0127327. (With translation).

* cited by examiner (a)

(b)

(c)

(a)

(b)

(c)

METHOD FOR MANUFACTURING SEMICONDUCTOR DEVICE AND SUBSTRATE PROCESSING APPARATUS

BACKGROUND OF THE INVENTION

1. Field of the Invention

The present invention relates to a method for manufacturing a semiconductor device including a step of forming a thin film on a substrate, and relates to a substrate processing apparatus.

2. Description of the Related Art

A flash memory includes an electronic storage region (floating gate) surrounded by an insulating film, and the operating principle is that information is written through exchange of electrons via a thin tunnel oxide film, and simultaneously electrons are retained for a long time by utilizing insulating property of this thin oxide film to keep memory. The information stored in the flash memory must be retained for as long as 10 years even if no external operation is performed, and there is a severe requirement for the insulating film surrounding a charge storage region called the floating gate. A stacked structure of an oxide film ($SiO_2$)/a nitride film ($Si_3N_4$)/an oxide film ($SiO_2$), which is generally called oxide-nitride-oxide (ONO), is used in an inter-layer insulating film provided between the floating gate and a control gate for controlling operation of a memory cell, and high leak current characteristics are expected.

Conventionally, the $SiO_2$ insulating film in the ONO stacked structure is formed in a high temperature region of about 800° C. by a CVD method using the gas such as $SiH_2Cl_2$ gas and $N_2O$ gas. With further microfabrication of a device, capacity drop of the nitride film in the ONO stacked film occurs. Accordingly, from a viewpoint of ensuring capacity, adoption of a high dielectric constant film replacing a nitride film layer is being investigated.

In order to suppress crystallization of the high dielectric constant film, the $SiO_2$ insulating film formed on a high dielectric constant film must be formed at a temperature lower than the temperature for forming the high dielectric constant film.

When an $SiO_2$ insulating film is formed, along with a lower temperature for forming the film, atoms other than silicon (Si) and oxygen (O) contained in a source used for forming the film are likely to remain in the film as impurities. Therefore, when the $SiO_2$ insulating film is formed at a low temperature by using organic source gas, there is a problem that carbon (C), hydrogen (H), nitrogen (N), etc, contained in organic source gas molecules remain in the $SiO_2$ insulating film as impurities. In addition, even when an inorganic source gas is used, there is a problem that hydrogen (H), chlorine (Cl), etc, contained in the source remain in the film as impurities.

Since these impurities significantly deteriorate film quality of the formed insulating film, there is a necessity for providing a technique of forming an insulating film of good quality with low concentration of impurities in the film at a low temperature.

Therefore, an object of the present invention is to provide a method for manufacturing a semiconductor device and a substrate processing apparatus, capable of solving the above-described problem, and forming an insulating film with extremely low concentration of the impurities in the film such as carbon, hydrogen, nitrogen, chlorine, etc., at a low temperature.

SUMMARY OF THE INVENTION

According to one aspect of the present invention, there is provided a method for manufacturing a semiconductor device, including the steps of:

forming a specific element-containing layer on a substrate by supplying source gas containing a specific element into a processing container in which the substrate is accommodated;

changing the specific element-containing layer into a nitride layer, by activating and supplying gas containing nitrogen into the processing container; and changing the nitride layer into an oxide layer or an oxynitride layer, by activating and supplying gas containing oxygen into the processing container;

with this cycle set as one cycle and performed for at least one or more times.

According to another aspect of the present invention, there is provided a method for manufacturing a semiconductor device, including the steps of:

forming a silicon-containing layer on a substrate by supplying source gas containing silicon into a processing container in which the substrate is accommodated;

changing the silicon-containing layer into a silicon nitride layer, by activating and supplying gas containing nitrogen into the processing container; and changing the silicon nitride layer into a silicon oxide layer or a silicon oxynitride layer, by activating and supplying gas containing oxygen into the processing container;

with this cycle set as one cycle and performed for at least one or more times.

According to still another aspect of the present invention, there is provided a method for manufacturing a semiconductor device, including the steps of:

forming a specific element-containing layer on a substrate by supplying source gas containing a specific element into a processing container in which the substrate is accommodated;

changing the specific element-containing layer into a nitride layer, by activating and supplying gas containing nitrogen into the processing container;

forming the specific element-containing layer on the nitride layer by supplying the source gas into the processing container; and changing the specific element-containing layer formed on the nitride layer and the nitride layer into an oxide layer or an oxynitride layer, by activating and supplying gas containing oxygen into the processing container;

with this cycle set as one cycle and performed for at least one or more times.

According to still another aspect of the present invention, there is provided a method for manufacturing a semiconductor device, including the steps of:

forming a silicon-containing layer on a substrate by supplying gas containing silicon into a processing container in which the substrate is accommodated;

changing the silicon-containing layer into a silicon nitride layer, by activating and supplying gas containing nitrogen into the processing container;

forming the silicon-containing layer on the silicon nitride layer by supplying the gas containing silicon into the processing container; and changing the silicon-containing layer formed on the silicon nitride layer and the silicon nitride layer into a silicon oxide layer or a silicon oxynitride layer, by activating and supplying gas containing oxygen into the processing container;

with this cycle set as one cycle and performed for at least one or more times.

According to still another aspect of the present invention, there is provided a substrate processing apparatus including:

a processing container configured to accommodate a substrate;

a source gas supply system configured to supply source gas containing a specific element into the processing container;

a nitrogen-containing gas supply system configured to supply gas containing nitrogen into the processing container;

an oxygen-containing gas supply system configured to supply gas containing oxygen into the processing container;

an activating mechanism configured to activate the gas containing nitrogen and the gas containing oxygen; and a controller configured to control the source gas supply system, the nitrogen-containing gas supply system, the oxygen-containing gas supply system, and the activating mechanism, so that a specific element-containing layer is formed on the substrate by supplying the source gas into the processing container in which the substrate is accommodated, then the specific element-containing layer is changed into a nitride layer, by activating and supplying the gas containing nitrogen into the processing container, and the nitride layer is changed into an oxide layer or an oxynitride layer, by activating and supplying the gas containing oxygen into the processing container, with this cycle set as one cycle and performed for at least one or more times.

According to still another aspect of the present invention, there is provided a substrate processing apparatus including:

a processing container configured to accommodate a substrate;

a source gas supply system configured to supply source gas containing a specific element into the processing container;

a nitrogen-containing gas supply system configured to supply gas containing nitrogen into the processing container;

an oxygen-containing gas supply system configured to supply gas containing oxygen into the processing container;

an activating mechanism configured to activate the gas containing nitrogen and the gas containing oxygen; and a controller configured to control the source gas supply system, the nitrogen-containing gas supply system, the oxygen-containing gas supply system, and the activating mechanism, so that a specific element-containing layer is formed on the substrate by supplying the source gas into the processing container in which the substrate is accommodated, then the specific element-containing layer is changed into a nitride layer, by activating and supplying the gas containing nitrogen into the processing container, and the specific element-containing layer is formed on the nitride layer by supplying the source gas into the processing container, and the specific element-containing layer formed on the nitride layer and the nitride layer are changed into an oxide layer or an oxynitride layer, by activating and supplying the gas containing oxygen into the processing container, with this cycle set as one cycle and performed for at least one or more times.

According to the present invention, there are provided a method for manufacturing a semiconductor device and a substrate processing apparatus capable of forming an insulating film with extremely low concentration of impurities such as carbon, hydrogen, nitrogen, chlorine, etc, in a film, at a low temperature.

DETAILED DESCRIPTION OF THE PREFERRED EMBODIMENTS

Preferred embodiments of the present invention will be described hereunder, with reference to the drawings.

Figure 1:
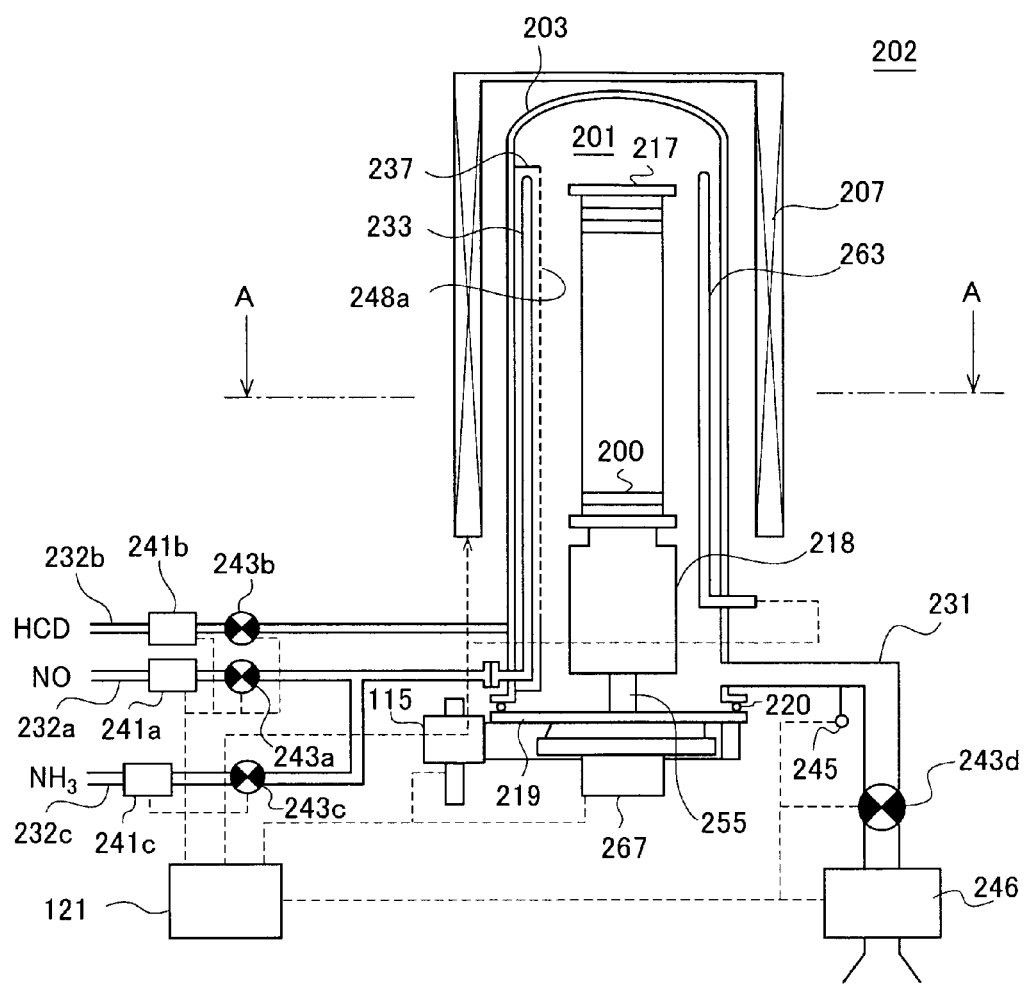
FIG. 1 is a schematic block diagram of a vertical processing furnace of a substrate processing apparatus which is preferably used in this embodiment, showing a processing furnace portion in vertical cross section.
Figure 2:
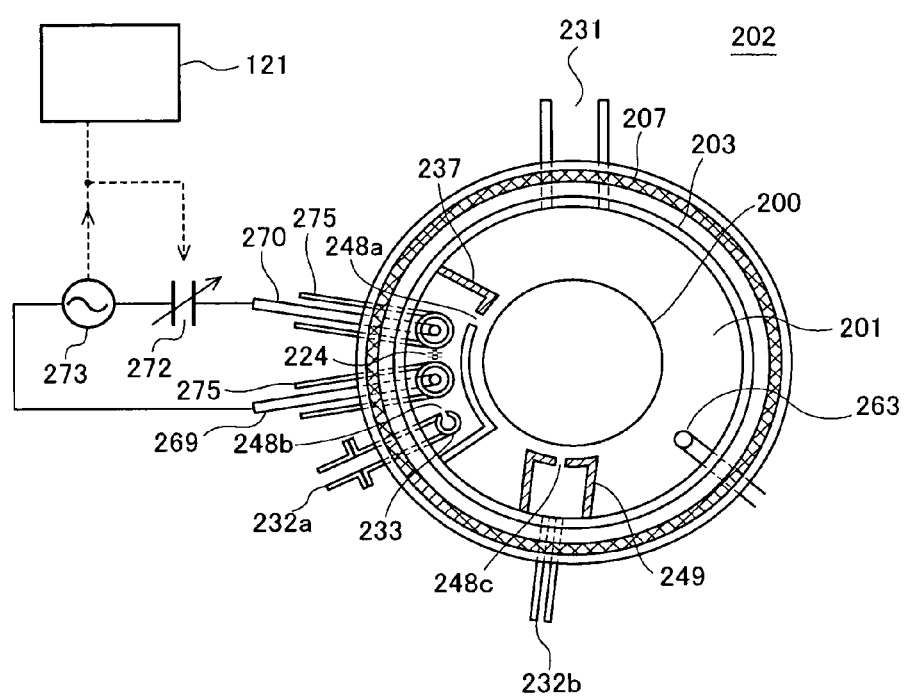
FIG. 2 is a schematic block diagram of the vertical processing furnace of the substrate processing apparatus which is preferably used in this embodiment, showing the processing furnace portion in cross section taken along line A-A of FIG. 1.

FIG. 1 is a schematic block diagram of a vertical processing furnace of a substrate processing apparatus which is preferably used in this embodiment, showing a processing furnace 202 portion in vertical cross section. FIG. 2 is a schematic block diagram of the vertical processing furnace which is preferably used in this embodiment, showing the processing furnace 202 portion in cross section taken along line A-A of FIG. 1.

As shown in FIG. 1, the processing furnace 202 has a heater 207, serving as heating unit (heating mechanism). The heater 207 is formed into a cylindrical shape and is vertically installed on a heater base (not shown) by being supported thereby. Note that, the heater 207 also functions as an activating mechanism for activating a gas by heat, as will be described later.

A reaction tube 203 constituting a reaction container (processing container) is disposed concentrically with the heater 207 in the heater 207. The reaction tube 203 is made of a heat-resistant material such as quartz (SiO$_2$), silicon carbide (SiC), or the like, and formed into a cylindrical shape with the upper end closed and the lower end opened. A processing chamber 201 is formed in a cylindrical hollow portion of the reaction tube 203, so that a wafer 200, being a substrate, can be accommodated in a state of being vertically arranged in multiple stages in a horizontal posture by a boat 217 as will be described later.

A gas nozzle 233 is provided in a lower part of the reaction tube 203 so as to pass through the reaction tube 203. A first gas supply tube 232a is connected to the gas nozzle 233, and a third gas supply tube 232c is connected to the first gas supply tube 232a. Also, a second gas supply tube 232b is connected to the reaction tube 203. Thus, the reaction tube 203 is provided with three gas supply tubes 232a, 232b, and 232c, so that plural kinds of gases, such as three kinds in this case, are supplied into the processing chamber 201.

A first mass flow controller 241a, being a flow rate control unit (flow rate controller), and a first valve 243a, being an open/close valve, are provided in the first gas supply tube 232a sequentially from an upstream direction. Also, a third gas supply tube 232c is connected to the first gas supply tube 232a at a downstream side of the first valve 243a. A third mass flow controller 241c, being a flow rate control unit (flow rate controller), and a third valve 243c, being an open/close valve, are provided in this third gas supply tube 232c sequentially from the upstream direction. As described above, the first gas supply tube 232a is connected to the gas nozzle 233, and a vertical portion of the gas nozzle 233 is provided in a buffer chamber 237 as will be described later formed in the processing chamber 201.

A second mass flow controller 241b, being the flow rate control unit (flow rate controller), and a second valve 243b, being the open/close valve, are provided sequentially from the upstream direction in the second gas supply tube 232b. The second gas supply tube 232b is connected to a gas supply part 249 as will be described later formed in the processing chamber 201.

From the first gas supply tube 232a, for example, a nitric monoxide gas (NO) is supplied, as a gas containing oxygen (oxygen-containing gas), into the processing chamber 201 via the first mass flow controller 241a, the first valve 243a, the gas nozzle 233, and the buffer chamber 237. Also, from the second gas supply tube 232b, for example, a hexachlorodisilane gas (Si$_2$Cl$_6$, abbreviated as HCD), being a silicon source gas, namely the gas containing silicon as a specific element (silicon-containing gas) is supplied into the processing chamber 201, via the second mass flow controller 241b, the second valve 243b, and the gas supply part 249. Also, from the third gas supply tube 232c, for example, ammonia gas (NH$_3$) is supplied, as a gas containing nitrogen (nitrogen-containing gas), into the processing chamber 201 via the third mass flow controller 241c, the third valve 243c, the first gas supply tube 232a, the gas nozzle 233 and the buffer chamber 237. An oxygen-containing gas supply system as the first gas supply system, is constituted mainly by the first gas supply tube 232a, the first mass flow controller 241a, the first valve 243a, the gas nozzle 233, and the buffer chamber 237. A source gas supply system as a second gas supply system, i.e., a silicon-containing gas supply system, is constituted mainly by the second gas supply tube 232b, the second mass flow controller 241b, the second valve 243b, and the gas supply part 249. A nitrogen-containing gas supply system, as the third gas supply system, is constituted mainly by the third gas supply tube 232c, the third mass flow controller 241c, the third valve 243c, the first gas supply tube 232a, the gas nozzle 233, and the buffer chamber 237.

An exhaust tube 231 for exhausting an atmosphere in the processing chamber 201 is provided in the reaction tube 203.

A vacuum pump 246, being a vacuum exhaust unit, via the pressure sensor 245 serving as a pressure detector, and the fourth valve 243d constituted of APC (Auto Pressure Controller) valve serving as a pressure adjuster, is connected to the exhaust tube 231 at the downstream side which is the opposite side to the side connected to the reaction tube 203 of the exhaust tube 231, and inside of the processing chamber 201 is vacuum-exhausted so as to be set in a prescribed pressure (degree of vacuum). Note that, the fourth valve 243d, being an APC valve, is the open/close valve capable of performing start/stop of vacuum-exhaust of the inside of the processing chamber 201 by opening/closing a valve, and further capable of adjusting the pressure by adjusting an opening degree of the valve. An exhaust system is constituted mainly by the exhaust tube 231, the fourth valve 243d, the vacuum pump 246, and the pressure sensor 245.

The buffer chamber 237, being a gas dispersion space, is provided along a loading direction (arrangement direction) of the wafer 200, from a lower part to an upper part of an inner wall of the reaction tube 203, in an arc-shaped space between the inner wall of the reaction tube 203 constituting the processing furnace 202 and the wafer 200. First gas supply holes 248a, being supply holes for supplying gas, are provided on an end portion of the wall adjacent to the wafer 200 of the buffer chamber 237. The first gas supply holes 248a are opened toward the center of the reaction tube 203. As shown in FIG. 1, a plurality of the first gas supply holes 248a are provided from the lower part to the upper part of the reaction tube 203, with each of them having the same opening area, at the same opening pitch.

The gas nozzle 233 is disposed on an end portion which is opposite side to the end portion where the first gas supply holes 248a of the buffer chamber 237 are provided, also along the loading direction of the wafer 200 from the lower part to the upper part of the reaction tube 203. Then, second gas supply holes 248b, being the supply holes for supplying gas, are provided in the nozzle 233 in such a manner as opening toward the center of the buffer chamber 237. In the same way as the first gas supply holes 248a of the buffer chamber 237, a plurality of the second gas supply holes 248b are provided from the lower part to the upper part of the reaction tube 203, each of them preferably having the same opening area at the same opening pitch from the upstream side (lower part) to the downstream side (upper part) when a differential pressure between the inside of the buffer chamber 237 and the inside of the processing chamber 201 is small. However, preferably each of them has a larger opening area or opening pitch of them is smaller from the upstream side toward the downstream side when the differential pressure is large.

In this embodiment, by adjusting each opening area and the opening pitch of the second gas supply holes 248b form the upstream side to the downstream side as described above, first, the gas having approximately the same flow rate, although having different flow velocity, is jetted from each one of the second gas supply holes 248b. Then, the gas jetted from each one of the second gas supply holes 248b is introduced into the buffer chamber 237 once, and a difference in flow velocity of the gas is made uniform in the buffer chamber 237.

Namely, the gas jetted into the buffer chamber 237 from each one of the second gas supply holes 248b is jetted into the processing chamber 201 from the first gas supply holes 248a, after a particle velocity of each gas is moderated in the buffer chamber 237. Thus, the gas jetted into the buffer chamber 237 from each one of the second gas supply holes 248b becomes the gas having uniform flow rate and flow velocity, when jetted into the processing chamber 201 from each one of the first gas supply holes 248a.

Further, as shown in FIG. 2, a first rod electrode 269, being a first electrode, and a second rod electrode 270, being a second electrode, having a thin and long structure, are disposed along the loading direction of the wafer 200 from the lower part to the upper part of the reaction tube 203. The first rod electrode 269 and the second rod electrode 270 are respectively provided in parallel to the gas nozzle 233. The first rod electrode 269 and the second rod electrode 270 are respectively protected by being covered with an electrode protective tube 275, being a protective tube for protecting each electrode from the upper part to the lower part. Either one of the first rod electrode 269 and the second rod electrode 270 is connected to a high-frequency electric power source 273 via a matching unit 272, and the other one is connected to earth, being a reference potential. As a result, plasma is generated in a plasma generating region 224 between the first rod electrode 269 and the second rod electrode 270. A plasma source (plasma generator) is constituted mainly by the first rod electrode 269, the second rod electrode 270, the electrode protective tube 275, the matching unit 272, and the high-frequency electric power source 273. Note that, the plasma source functions as the activating mechanism for activating the gas by plasma, as will be described later.

The first rod electrode 269 and the second rod electrode 270 can be respectively inserted into the buffer chamber 237 in a state of being separated from an atmosphere of the buffer chamber 237 by the electrode protective tube 275. Here, if the inside of the electrode protective tube 275 has the same atmosphere as that of outside air (atmospheric pressure), the first rod electrode 269 and the second rod electrode 270 inserted into the electrode protective tubes 275 are oxidized by heat of the heater 207. Accordingly, an inactive gas purge mechanism is provided, wherein the inside of the electrode protective tube 275 is filled with inactive gas such as nitrogen or purged by this gas, to thereby sufficiently suppress oxygen concentration to be low and prevent oxidation of the first rod electrode 269 or the second rod electrode 270.

Further, as shown in FIG. 2, the gas supply part 249, serving as a gas dispersion space which is different from the buffer chamber 237, is provided on the inner wall of the reaction tube 203 at a part rotated from the position of the first gas supply holes 248a by approximately 120 degrees. The gas supply part 249 is provided along the loading direction of the wafer 200, at a part extending from the lower part to the upper part of the inner wall of the reaction tube 203. This gas supply part 249 is a supply part for sharing the kind of the gas supply with the buffer chamber 237, when a plurality of gases are alternately supplied one by one to the wafer 200, in the film forming step as will be described later.

Third gas supply holes 248c, being the supply holes for supplying gas to a position adjacent to the wafer in the same way as the buffer chamber 237, are also provided in this gas supply part 249. The third gas supply holes 248c are opened toward the center of the reaction tube 203. The second gas supply tube 232b is connected to the lower part of the gas supply part 249.

In the same way as the first gas supply holes 248a of the buffer chamber 237, a plurality of third gas supply holes 248c are provided from the lower part to the upper part of the reaction tube 203, with each of them having the same opening area at the same opening pitch from the upstream side (lower part) to the downstream side (upper part), when the differential pressure between the inside of the buffer chamber 237 and the inside of the processing chamber 201 is small. However, in a case of a large differential pressure, the opening area is preferably set larger or set at a small opening pitch, from the upstream side toward the downstream side.

A seal cap 219 serving as a lid member of a furnace opening capable of air-tightly closing a lower end opening of the reaction tube 203, is provided in the lower part of the reaction tube 203. The seal cap 219 is abutted on the lower end of the reaction tube 203 from the lower side in a vertical direction. The seal cap 219 is made of metal such as stainless, and is formed into a disc-shape. An O-ring 220 serving as a seal member, which is abutted on the lower end of the reaction tube 203, is provided on the upper surface of the seal cap 219. A rotation mechanism 267 for rotating the boat 217 is installed on the side opposite to the processing chamber 201 of the seal cap 219. A rotary shaft 255 of the rotation mechanism 267 passes through the seal cap 219 and connected to a boat 217 as will be described later, to thereby rotate the boat 217 and accordingly rotate the wafer 200. The seal cap 219 is vertically elevated by a boat elevator 115, being an elevation mechanism vertically disposed at the outside of the reaction tube 203. Thus, the boat 217 can be loaded and unloaded to/from the processing chamber 201.

The boat 217 serving as a substrate holding tool is made of a heat-resistant material such as quartz or silicon carbide, and is constituted so that a plurality of wafers 200 are arranged, with centers thereof mutually aligned, in a horizontal posture, in multiple stages. Note that a heat insulating member 218 made of the heat-resistant material such as quartz or silicon carbide is provided in the lower part of the boat 217, and heat from the heater 207 is hardly transmitted to the seal cap 219 side. Note that the heat-insulating member 218 may be constituted of a plurality of heat insulating plates made of the heat-resistant material such as quartz or silicon carbide, and a heat insulating plate holder for supporting them in a horizontal posture in multiple stages. A temperature sensor 263 serving as a temperature detector, is installed inside of the reaction tube 203, and by adjusting a electric power supply state to the heater 207 based on temperature information detected by the temperature sensor 263, the temperature inside of the processing chamber 201 is set to have a desired temperature distribution. The temperature sensor 263 is provided along the inner wall of the reaction tube 203, in the same way as the gas nozzle 233.

A controller 121, serving as a control part (control unit), is connected to first to third mass flow controllers 241a, 241b, and 241c, first to fourth valves 243a, 243b, 243c, and 243d, the pressure sensor 245, the heater 207, the temperature sensor 263, the vacuum pump 246, the boat rotation mechanism 267, the boat elevator 115, the high-frequency electric power source 273, the matching unit 272, and the like. The controller 121 controls flow rate adjustment of the first to third mass flow controllers 241a, 241b, 241c, opening/closing operation of the first to third valves 243a, 243b, 243c, opening/closing operation of the fourth valve (APC valve) 243d and pressure adjustment operation based on the pressure sensor 245, temperature adjustment of the heater 207 based on the temperature sensor 263, start/stop of the vacuum pump 246, rotation speed adjustment of the boat rotation mechanism 267, elevating operation of the boat elevator 115, electric power supply to the high frequency electric power source 273, and impedance by the matching unit 272.

Next, two sequence examples (first sequence and second sequence) for forming the oxide film, being an insulating film, on the substrate, will be described as one step of manufacturing steps of the semiconductor device by using the processing furnace of the aforementioned substrate processing apparatus. Note that in the description given hereunder, the operation of each part constituting the substrate processing apparatus is controlled by the controller 121.

(First Sequence)

First, the first sequence of this embodiment will be described.

Figure 3:
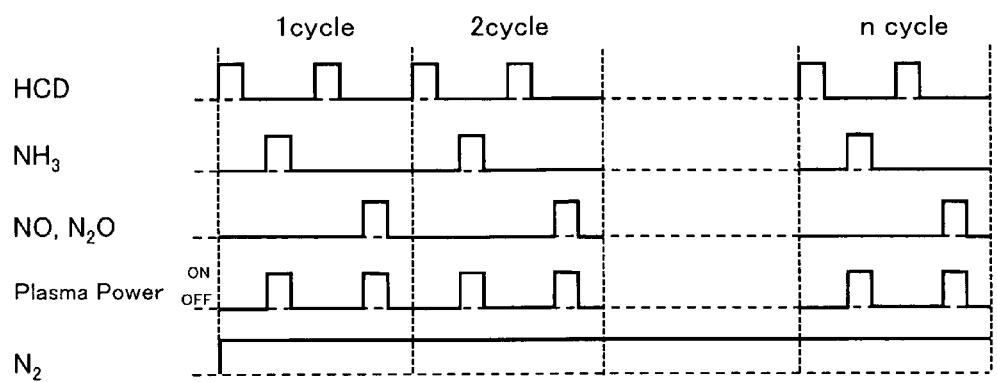
FIG. 3 is a view showing the timing of gas supply and plasma power supply in a first sequence of this embodiment.

FIG. 3 shows a timing chart for gas supply and plasma power supply in the first sequence of this embodiment. The first sequence of this embodiment includes a first step of forming an adsorption layer of a source or a layer of a specific element (called a specific element-containing layer) on the substrate by supplying a source gas containing the specific element to the substrate; a second step of changing the specific element-containing layer into a nitride layer by activating gas containing nitrogen by plasma or heat and supplying this gas to the specific element-containing layer; a third step of forming the specific element-containing layer on the nitride layer by supplying the source gas to the nitride layer; and a fourth step of changing the specific element-containing layer formed on the nitride layer and the nitride layer into an oxide layer by activating gas containing oxygen by plasma and supplying this gas to the specific element-containing layer formed on the nitride layer, with this cycle set as one cycle and performed for at least one or more times under a condition that ALD (Atomic Layer Deposition) reaction or CVD (Chemical Vapor Deposition) reaction occurs. Thus, the oxide film of a desired film thickness is formed. Note that under the condition that the ALD reaction occurs, the adsorption layer of the source is formed on the substrate, and under the condition that the CVD reaction occurs, the layer of the specific element is formed on the substrate. Here, the adsorption layer of the source includes a discontinuous adsorption layer of molecules of the source, in addition to a continuous adsorption layer of molecules of the source.

Also, the layer of the specific element includes a discontinuous layer constituted of the specific element in addition to the continuous layer constituted of the specific element, and the thin film formed by overlapped layers of the continuous layer and/or the discontinuous layer.

Note that the continuous layer constituted of the specific element is also sometimes called the thin film. In the first step, the specific element-containing layer from under one atomic layer to several atomic layers is formed on the substrate, and in the second step, this specific element-containing layer is changed into the nitride layer. In the third step, the specific element-containing layer from under one atomic layer to several atomic layers is formed on the nitride layer, and in the fourth step, both of the specific element-containing layer and the nitride layer which is a foundation layer (base layer) of the specific element-containing layer are changed into an oxide layer. Note that the layer of under one atomic layer means the atomic layer formed discontinuously.

Specific description will be given hereunder. Note that in the first sequence of this embodiment, description will be given for an example of forming a silicon oxide film on the substrate as the insulating film, by using HCD gas, as the source gas, being the gas containing silicon as the specific element, using $NH_3$ gas as the gas containing nitrogen, and using NO gas as the gas containing oxygen.

When the boat 217 is charged with a plurality of the wafers 200 (wafer charge), as shown in FIG. 1, the boat 217 holding a plurality of wafers 200 is lifted by the boat elevator 115 and loaded into the processing chamber 201 (boat load). In this state, the seal cap 219 is set in a state of sealing the lower end of the reaction tube 203 via the O ring 220.

The processing chamber 201 is vacuum-exhausted by the vacuum pump 246, so that the inside of the processing camber 201 is set in a desired pressure (degree of vacuum). At this time, the pressure in the processing chamber 201 is measured by the pressure sensor 245, and the fourth valve (APC valve) 243d is feed-back controlled based on the measured pressure. In addition, the inside of the processing chamber 201 is heated by the heater 207, so that the inside of the processing chamber 201 is set to be a desired temperature. At this time, the electric power supply state to the heater 207 is feed-back controlled based on the temperature information detected by the temperature sensor 263 for detecting the temperature in the processing chamber 201, so that the inside of the processing chamber 201 has a desired temperature distribution. Subsequently, the boat 217 is rotated by the rotation mechanism 267, thereby rotating the wafers 200. Thereafter, four steps as will be described later, are sequentially executed.

[Step 1]

In Step 1, both the second valve 243b of the second gas supply tube 232b and the fourth valve 243d of the gas exhaust tube 231 are opened, and the HCD gas supplied from the second gas supply tube 232b, with the flow rate adjusted by the second mass flow controller 241, is exhausted from the gas exhaust tube 231, while being supplied into the processing chamber 201 from the third gas supply holes 248c of the gas supply part 249. At this time, the pressure in the processing chamber 201 is set to be a pressure for example, within a range of 10 to 1000 Pa by properly adjusting the fourth valve 243d. The supply flow rate of the HCD gas controlled by the second mass flow controller 241b is set to be a flow rate, for example, within a range of 10 to 1000 sccm. The time required for exposing the HCD gas to the wafer 200 is set to be the time, for example, within a range of 2 to 120 seconds. At this time, the temperature of the heater 207 is set to be about the temperature of allowing the ALD reaction or the CVD reaction to occur in the processing chamber 201, namely set to be the temperature so that the temperature of the wafer 200 is set within a range of 300 to 650° C. Note that when the temperature of the wafer 200 is under 300° C., the HCD is hardly adsorbed on the wafer 200. Also, when the temperature of the wafer 200 exceeds 650° C., the CVD reaction is strongly progressed, and the uniformity is easily deteriorated. Therefore, preferably the temperature of the wafer 200 is set in a range of 300 to 650° C. By supply of the HCD gas, the HCD is adsorbed and deposited on the surface of a foundation film of the surface of the wafer 200 and further thermally decomposed, to thereby form the adsorption layer of the HCD or the silicon layer (called silicon-containing layer hereunder) from under one atomic layer to several atomic layers on the wafer 200 (on the foundation film). Note that under the condition that the ALD reaction occurs, the adsorption layer of the HCD is formed on the wafer 200, and under the condition that the CVD reaction occurs, the silicon layer is formed on the wafer 200. Here, the adsorption layer of the HCD includes the discontinuous adsorption layer of HCD molecules, in addition to the continuous adsorption layer of HCD molecules.

Also, the silicon layer includes the discontinuous layer constituted of silicon in addition to the continuous layer constituted of silicon and the thin film formed by overlapped layers of the continuous layer and/or the discontinuous layer.

Note that the continuous layer constituted of silicon is also sometimes called the thin film. Note that when the thickness of the silicon-containing layer formed on the wafer 200 exceeds several atomic layers, nitridation action and oxidation action in steps 2 and 4 as will be described later do not cover an entire body of the silicon-containing layer. Also, a minimum value of the silicon-containing layer that can be formed on the wafer 200 is under one atomic layer. Therefore, preferably the thickness of the silicon-containing layer is set to be a value from under one atomic layer to several atomic layers. After the silicon-containing layer is formed, the second valve 243b is closed, and the supply of the HCD gas is stopped. At this time, the inside of the processing chamber 201 is vacuum-exhausted, with the fourth valve 243d opened, and the HCD gas not reacted or the HCD gas after contributing to film formation, which are remained in the processing chamber 201, is removed from the processing chamber 201. At this time, when the inactive gas such as $N_2$ is supplied into the processing chamber 201, it is possible to increase the effect of removing the HCD gas unreacted or the HCD gas after contributing to the film formation, which are remained in the processing chamber 201, from the processing chamber 201.

As the source containing Si, not only an inorganic source such as TCS (tetrachlorosilane, $SiCl_4$), DCS (dichlorosilane, $SiH_2Cl_2$), $SiH_4$ (monosilane), or the like, but also an organic source such as aminosilane-based 4DMAS (tetrakis(dimethylamino)silane, $Si(N(CH_3)_2))_4$), 3DMAS (tris(dimethylamino)silane, $Si(N(CH_3)_2)_3H$), 2DEAS (bis(diethylamino)silane, $Si(N(C_2H_5)_2)_2H_2$), BTBAS (Bis(tertiary-butylamino) silane, $SiH_2(NH(C_4H_9))_2$), or the like, may be used, in addition to HCD.

[Step 2]

In Step 2, both the third valve 243c of the third gas supply tube 232c and the fourth valve 243d of the gas exhaust tube 231 are opened, and the $NH_3$ gas supplied from the third gas supply tube 232c, with the flow rate adjusted by the third mass flow controller 241, is jetted into the buffer chamber 237 from the second gas supply holes 248b of the gas nozzle 233 via the first gas supply tube 232a. At this time, by applying high frequency electric power between the first rod electrode 269 and the second rod electrode 270 from the high frequency electric power source 273 via the matching unit 272, the $NH_3$ is excited by plasma, and is exhausted from the gas exhaust tube 231 while being supplied into the processing chamber 201 from the first gas supply holes 248a as an active species. When the $NH_3$ gas is excited by plasma and flown as the active species, the pressure in the processing chamber 201 is set in the pressure, for example, within a range of 10 to 100 Pa by properly adjusting the fourth valve 243d. The supply flow rate of the $NH_3$ controlled by the third mass flow controller 241c is set to be the flow rate, for example, within a range of 1000 to 10000 sccm. The time required for exposing the wafer 200 to the active species obtained by exciting the $NH_3$ by plasma is set to be the time, for example, within a range of 2 to 120 seconds. The temperature of the heater 207 at this time is set to be the temperature, so that the temperature of the wafer 200 is set to be the temperature within a range of 300 to 650° C., in the same way as step 1. Note that the high frequency electric power applied between the first rod electrode 269 and the second rod electrode 270 from the high frequency electric power source 273 is set to be a power, for example, within a range of 50 to 400 W. The $NH_3$ has a high reaction temperature and is hardly reacted at the aforementioned wafer temperature and under the aforementioned pressure in the processing chamber. Therefore, the $NH_3$ is flown as the active species by exciting it by plasma. Accordingly, the temperature of the wafer 200 may be set in a low temperature range set as described above. It is also possible that the $NH_3$ gas is not excited by plasma when it is supplied, and by setting the pressure in the processing chamber 201 to be the pressure, for example, within a range of 50 to 3000 Pa by properly adjusting the fourth valve 243d, the $NH_3$ gas is thermally activated in a non-plasma state.

At that time, the gas flown into the processing chamber 201 is the active species obtained by exciting the $NH_3$ by plasma, or the $NH_3$ gas thermally activated by increasing the pressure in the processing chamber 201, and the HCD gas is not flown into the processing chamber 201. Accordingly, the $NH_3$ causes no vapor phase reaction, and the $NH_3$ tuned into the active species or activated $NH_3$ causes surface reaction with a foundation silicon-containing layer (the adsorption layer of the HCD or the silicon layer) formed on the wafer 200 in Step 1, and the foundation silicon-containing layer is nitrided and changed into the silicon nitride layer (called an $Si_3N_4$ layer, which will be hereinafter also called simply an SiN layer).

Thereafter, the supply of the $NH_3$ is stopped by closing the third valve 243c of the third gas supply tube 232c. At this time, the inside of the processing chamber 201 is exhausted to have the pressure of 20 Pa or less by the vacuum pump 246, with the fourth valve 243d of the gas exhaust tube 231 opened, and residual $NH_3$ is removed from the processing chamber 201. At this time, when the inactive gas such as $N_2$ is supplied into the processing chamber 201, the effect of removing the residual $NH_3$ is further increased.

As an activated gas containing N, in addition to a gas obtained by exciting $NH_3$ by plasma or by heat, the gas obtained by exciting $N_2$, $NF_3$, $N_3H_8$, etc, by plasma or by heat may be used. Alternatively, the gas obtained by diluting the aforementioned gas with rare gas, such as Ar, He, Ne, Xe, etc, may be used under excitation by plasma or by heat.

[Step 3]

In Step 3, both the second valve 243b of the second gas supply tube 232b and the fourth valve 243d of the gas exhaust tube 231 are opened, the HCD gas supplied from the second gas supply tube 232b, with the flow rate adjusted by the second mass flow controller 241, is exhausted from the gas exhaust tube 231 while being supplied into the processing chamber 201 from the third gas supply holes 248c of the gas supply part 249. At this time, the pressure in the processing chamber 201 is set to be a pressure, for example, within a range of 10 to 1000 Pa by properly adjusting the fourth valve 243d. The flow rate of the HCD gas controlled by the second mass flow controller 241b is set to be the flow rate, for example, within a range of 10 to 1000 sccm. The time required for exposing the wafer 200 to the HCD gas is set to be, for example within a range of 2 to 120 seconds. At this time, the temperature of the heater 207 is set to be about the temperature of allowing the ALD reaction or the CVD reaction to occur in the processing chamber 201, namely set to be the temperature, so that the temperature of the wafer 200 is set to be, for example, within a range of 300 to 650° C. By the supply of the HCD gas, the HCD is adsorbed and deposited on the foundation film of the surface of the wafer 200, namely the silicon nitride film formed in step 2 and further thermally decomposed, and the silicon-containing layer (the adsorption layer of the HCD or the silicon layer) from under one atomic layer to several atomic layers is formed on the wafer 200 (on the foundation film). After the silicon-containing layer is formed, the second valve 243b is closed, and the supply of the HCD gas is stopped. At this time, the inside of the processing chamber 201 is vacuum-exhausted, with the fourth valve 243d opened, and the HCD gas not reacted or the HCD gas after contributing to film formation, which are remained in the processing chamber 201, is removed from the processing chamber 201. At this time, when the inactive gas such as $N_2$ is supplied into the processing chamber 201, it is possible to increase the effect of removing the HCD gas unreacted or the HCD gas after contributing to the film formation, which are remained in the processing chamber 201, from the processing chamber 201.

As a source containing Si, in addition to HCD, not only an inorganic source, such as TCS (tetrachlorosilane, $SiCl_4$), DCS (dichlorosilane, $SiH_2Cl_2$), $SiH_4$ (monosilane), or the like, but also an organic source, such as aminosilane-based 4DMAS (tetrakis(dimethylamino)silane, $Si(N(CH_3)_2))_4$), 3DMAS (tris(dimethylamino)silane, $Si(N(CH_3)_2))_3H$), 2DEAS (bis(diethylamino)silane, $Si(N(C_2H_5)_2)_2H_2$), BTBAS (Bis(tertiary-butylamino)silane, $SiH_2(NH(C_4H_9))_2$), or the like may be used.

[Step 4]

In Step 4, the NO gas supplied from the first gas supply tube 232a, with the flow rate adjusted by the first mass flow controller 241a, is jetted into the buffer chamber 237 from the second gas supply holes 248b of the gas nozzle 233, by opening both the first valve 243a of the first gas supply tube 232a and the fourth valve 243d of the gas exhaust tube 231. At this time, by applying the high frequency electric power between the first rod electrode 269 and the second rod electrode 270 from the high frequency electric power source 273 via the matching unit 272, this NO gas is excited by plasma and exhausted from the gas exhaust tube 231 while being supplied into the processing chamber 201 from the first gas supply holes 248a as the active species. When the NO gas is excited by plasma and flown as the active species, the pressure in the processing chamber 201 is set to be the pressure, for example within a range of 10 to 100 Pa by properly adjusting the fourth valve 243d. The supply flow rate of the NO gas controlled by the first mass flow controller 241a is set to be, for example within a range of 100 to 10000 sccm. The time required for exposing the wafer 200 to the active species obtained by exciting the NO gas by plasma is set to be, for example within a range of 2 to 120 seconds. The temperature of the heater 207 at this time is set, so that the temperature of the wafer 200 is set to be within a range of 300 to 650° C., in the same way as a supply time of the HCD gas. In addition, the high frequency electric power applied between the first rod electrode 269 and the second rod electrode 270 from the high frequency electric power source 273 is set to be, for example within a range of 50 to 400 W. The NO gas has a high reaction temperature, and reaction hardly occurs at the aforementioned wafer temperature and under the aforementioned pressure in the processing chamber. Therefore, the NO gas is excited by plasma and flown as the active species. Therefore, the temperature of the wafer 200 may be set within a low temperature range as described above.

At this time, the gas flown into the processing chamber 201 is the active species obtained by exciting the NO gas by plasma, and neither HCD gas nor $NH_3$ gas is flown into the processing chamber 201. Accordingly, the NO gas causes no vapor phase reaction, and the NO, turned into the active species, causes surface reaction with the silicon-containing layer and the silicon nitride layer, being the foundation of the silicon-containing layer formed in step 2, and both the silicon-containing layer and the silicon nitride layer are oxidized and changed into the silicon oxide layer (called a $SiO_2$ layer, which will be hereinafter also called simply a SiO layer).

Thereafter, the supply of the NO gas is stopped by closing the first valve 243a of the first gas supply tube 232a. At this time, the inside of the processing chamber 201 is exhausted to have the pressure of 20 Pa or less by the vacuum pump 246, with the fourth valve 243d of the gas exhaust tube 231 opened, and the residual NO is removed from the processing chamber 201. At this time, when the inactive gas such as $N_2$ is supplied into the processing chamber 201, the effect of removing the residual NO is further increased.

By performing a changing step of changing the silicon nitride layer and the silicon-containing layer into the silicon oxide layer by using the activated NO gas, as described in step 4, Si—N, Si—Cl, and Si—H bonds contained in the silicon nitride layer and the silicon-containing layer are decoupled by an energy of the activated NO gas. The energy for forming the Si—O bond is greater than a bonding energy of Si—N, Si—Cl, Si—H, and therefore by adding energy required for forming the Si—O bond, to the silicon nitride layer and the silicon-containing layer subjected to oxidation processing, the Si—N, Si—Cl, Si—H bonds in the silicon nitride layer and the silicon-containing layer are decoupled. N, H, Cl, in a state of decoupling the bonds with Si, are removed from a film, and exhausted as $N_2$, $H_2$, $Cl_2$, and HCl, etc. Then, excess bonding hands of Si as a result of decoupling the bond with N, H, Cl, are coupled with O contained in the activated NO gas, thus the silicon nitride layer and the silicon-containing layer are changed into the $SiO_2$ layer.

It is confirmed that the $SiO_2$ film formed by this technique is a good quality film, with extremely low nitrogen, hydrogen, and chlorine concentration in the film, and having Si/O ratio extremely close to 0.5 which is a stoichiometric composition.

As an activated gas containing O, the gas obtained by exciting $O_2$, $N_2O$, $N_2O_4$, etc, by plasma may be used, in addition to the gas obtained by exciting NO by plasma. Alternatively, the gas obtained by diluting the aforementioned gas with rare gas such as Ar, He, Ne, Xe, etc, may be excited by plasma and used. Alternatively, $O_3$ may be used as the activated gas containing O, and the gas obtained by diluting $O_3$ with the rare gas such as Ar, He, Ne, Xe, etc, may be excited by plasma and used.

The aforementioned steps 1 to 4 are set as one cycle, and by repeating this cycle for multiple number of times, the silicon oxide film of a prescribed film thickness can be formed on the wafer 200.

When the silicon oxide film of a prescribed film thickness is formed, the inside of the processing chamber 201 is purged by the inactive gas such as $N_2$ by exhausting this inactive gas from the processing chamber 201 while supplying it into the processing chamber 201. Thereafter, the atmosphere in the processing chamber 201 is replaced with the inactive gas, and the pressure in the processing chamber is returned to a normal pressure.

Subsequently, the seal cap 219 is lowered by the boat elevator 115, and the lower end of the reaction tube 203 is opened, and a processed wafer 200 is unloaded to the outside of the reaction tube 203 from the lower end of the reaction tube 203, in a state of being held by the boat 217 (boat unload). Thereafter, the processed wafer 200 is taken out from the boat 217 (wafer discharge).

(Second Sequence)

Next, a second sequence of this embodiment will be described.

Figure 4:
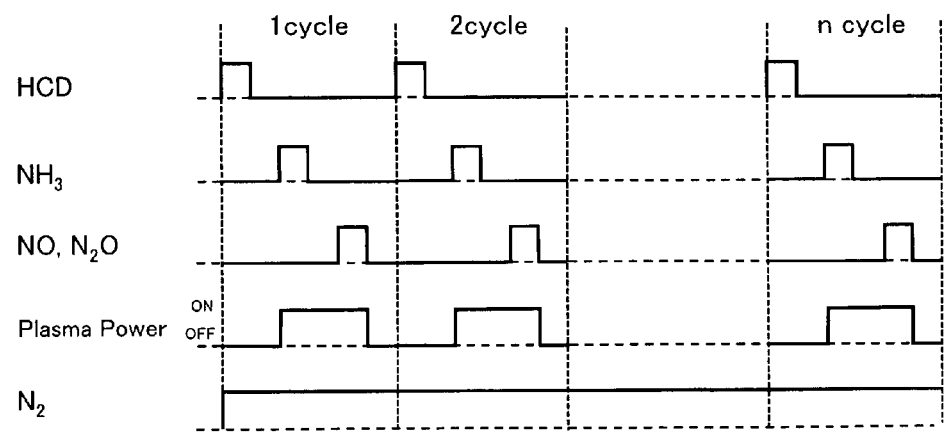
FIG. 4 is a view showing the timing of gas supply and plasma power supply in a second sequence of the present embodiment.

FIG. 4 shows a timing chart for gas supply and plasma power supply in the second sequence of this embodiment. The second sequence of this embodiment includes the first step of forming a specific element-containing layer (the adsorption layer of a source or the layer of a specific element) on the substrate by supplying a source gas containing the specific element to the substrate; the second step of changing the specific element-containing layer into a nitride layer by activating gas containing nitrogen by plasma or heat and supplying this gas to the specific element-containing layer; and the third step of changing the nitride layer into an oxide layer by activating gas containing oxygen by plasma and supplying this gas to the nitride layer, with this cycle set as one cycle and performed for at least one or more times under the condition that ALD reaction or CVD reaction occurs. Thus, the oxide film of a desired film thickness is formed. In the first step, the specific element-containing layer from under one atomic layer to several atomic layers is formed on the substrate, and in the second step, this specific element-containing layer is changed into the nitride layer, and in the third step, this nitride layer is changed into the oxide layer.

Note that, the second sequence is different from the first sequence only in the point that the second sequence has no step corresponding to the step 3 (the step of forming the Si-containing layer on the SiN layer) in the first sequence, and the other point is the same as the first sequence.

Namely, the step 3 (the step of forming the Si-containing layer on the SiN layer) in the first sequence is eliminated, and instead, step 4 (the step of changing the layer into the SiO layer) in the first sequence is earlier performed as step 3. This sequence corresponds to the second sequence.

The processing condition and used gas in each step of the second sequence are also the same as those of the first sequence. However, in the second sequence, an object to be changed into the SiO layer in step 3 is different from that of the first sequence. In step 4 of the first sequence, the Si-containing layer and the SiN layer are changed into the SiO layer. However, in step 3 of the second sequence, the SiN layer is changed into the SiO layer.

In Step 3 of the second sequence, by performing a changing step of changing the silicon nitride layer into the silicon oxide layer by using the activated NO gas, the Si—N, Si—Cl, and Si—H bonds contained in the silicon nitride layer are decoupled by the energy of the activated NO gas. The energy for forming the Si—O bond is greater than the bonding energy of the Si—N, Si—Cl, Si—H, and therefore by adding the energy required for forming the Si—O bond to the silicon nitride layer as the oxidation processing object, the Si—N, Si—Cl, and Si—H bonds in the silicon nitride layer are decoupled. N, H, Cl, in a state of decoupling the bonds with Si, are removed from a film, and exhausted as $N_2$, $H_2$, $Cl_2$, and HCl, etc. Then, the excess bonding hands of Si as a result of decoupling the bond with N, H, Cl, are coupled with 0 contained in the activated NO gas and the SiN layer is changed into the $SiO_2$ layer. It is confirmed that the $SiO_2$ film formed by this technique is a good quality film, with extremely low nitrogen, hydrogen, and chlorine concentration in the film, and having Si/O ratio extremely close to 0.5 which is a stoichiometric composition.

EXAMPLES

First Example

Next, a first example will be described.

The silicon oxide film is formed by the first sequence and the second sequence of this embodiment and a sequence of a conventional technique, and a film forming rate and uniformity of a film thickness distribution of this silicon oxide film are measured. Note that the sequence of the conventional technique means the sequence for repeating alternately the step 1 and step 4 in the first sequence of this embodiment (the sequence for repeating step 1 and step 3 alternately in the second sequence). The film forming condition (processing condition in each step) in this example is the condition within a range of the condition described in the aforementioned embodiment.

Figure 5:
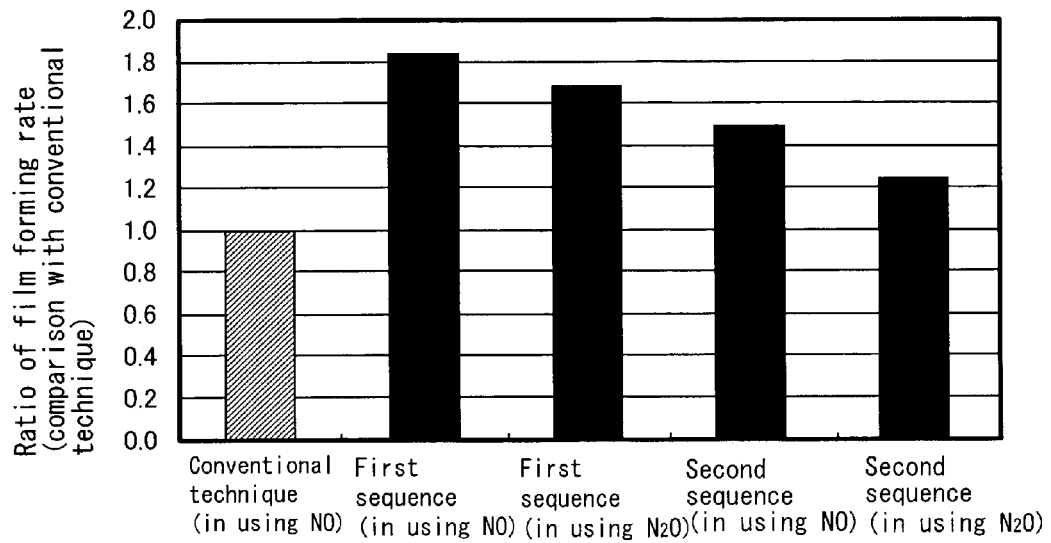
FIG. 5 is a view showing a ratio of a film forming rate of a silicon oxide film formed by a sequence of a conventional art and silicon oxide films formed by the first sequence and the second sequence of this embodiment.
Figure 6:
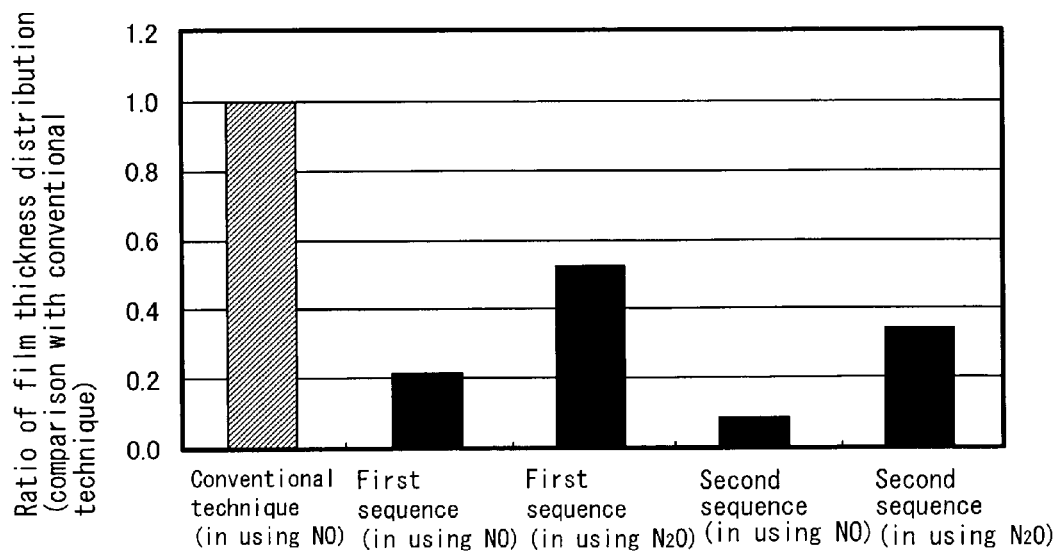
FIG. 6 is a view showing a ratio of a film thickness distribution uniformity of the silicon oxide film formed by the sequence of the conventional art and silicon oxide films formed by the first sequence and the second sequence of this embodiment.

The result is shown in FIG. 5 and FIG. 6. FIG. 5 shows the ratio of the film forming rate of the silicon oxide film formed by the first sequence and the second sequence of this embodiment, when the film forming rate of the silicon oxide film formed by the sequence of the conventional technique is set to be 1. FIG. 6 shows the ratio of uniformity of the film thickness distribution in a wafer surface of the silicon oxide film formed by the first sequence and the second sequence of this embodiment, when the uniformity of the film thickness distribution in the wafer surface of the silicon oxide film formed by a sequence of the conventional technique is set to be 1. Note that the uniformity of the film thickness distribution shows a degree of variation of the film thickness distribution in the wafer surface, and as this value is smaller, an excellent uniformity of the film thickness distribution is shown in the wafer surface.

As shown in FIG. 5, it is found that the film forming rate of the silicon oxide film formed by the first sequence and the second sequence of this embodiment is considerably higher than that of the silicon oxide film formed by the sequence of the conventional technique. Particularly, according to the first sequence of this embodiment, it is found that the film forming rate approximately twice the film forming rate by the sequence of the conventional technique can be obtained. Also, in a case of the second sequence of this embodiment also, it is found that the film forming rate of about 1.5 times the film forming rate by the sequence of the conventional technique can be obtained.

In addition, as shown in FIG. 6, it is found that the silicon oxide film formed by the first sequence and the second sequence of this embodiment has considerably improved uniformity of the film thickness distribution, compared with the silicon oxide film formed by the sequence of the conventional technique. Particularly, according to the second sequence of this embodiment, it is found that extremely excellent uniformity of the film thickness distribution of about 1/10 of the uniformity of the film thickness distribution of the silicon oxide film formed by the sequence of the conventional technique can be obtained. Even in a case of the first sequence of this embodiment also, it is found that extremely excellent uniformity of the film thickness distribution of about 1/5 of the uniformity of the film thickness distribution of the silicon oxide film formed by the sequence of the conventional technique can be obtained.

When the first sequence and the second sequence of this embodiment are compared, it is found that the film forming rate of the first sequence is higher than that of the second sequence. Meanwhile, regarding the uniformity of the film thickness distribution, it is found that the second sequence is more excellent than the first sequence. This reveals that the first sequence is more excellent than the second sequence in the point of the film forming rate, and the second sequence is more excellent than the first sequence in the point of the uniformity of the film thickness distribution.

In addition, when the kinds of the gas used in the first sequence and the second sequence of this embodiment are compared, it is found that the film forming rate is higher and the uniformity of the film thickness distribution is more improved in a case of using NO than in a case of using $N_2O$. Therefore, in either sequence, it is found that the film forming rate is higher and the uniformity of the film thickness distribution is more excellent in the case of using NO.

Here, in the first sequence and the second sequence of this embodiment, explanation will be given for a merit of not directly oxidizing the silicon-containing layer (adsorption layer of HCD or silicon layer) formed on the substrate, but oxidizing the silicon-containing layer after nitriding the silicon-containing layer once. Here, the explanation is given for the second sequence of this embodiment, while comparing this sequence with the sequence of the conventional technique (sequence of alternately repeating step 1 and step 3 in the second sequence of this embodiment).

Figure 9:
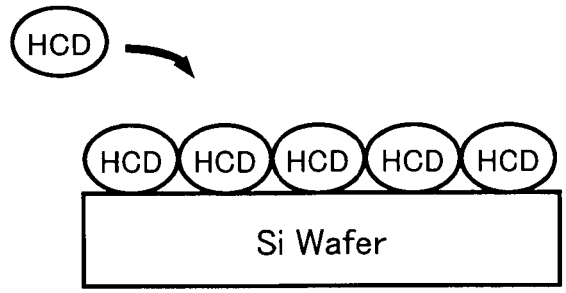
FIG. 9 is a schematic view showing the $SiO_2$ deposition model in the sequence of the conventional art.
Figure 9:
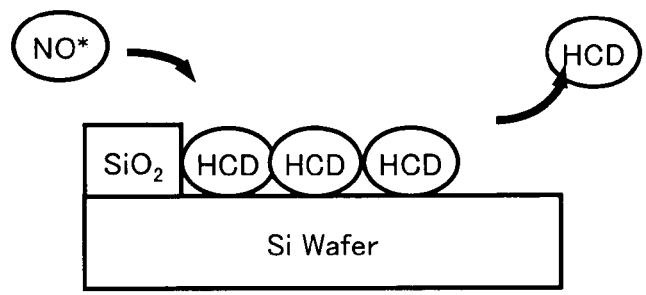
Figure 9:
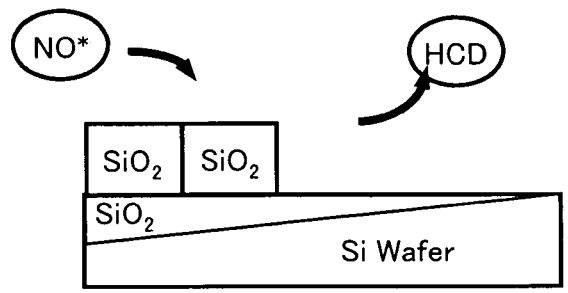
Figure 10:
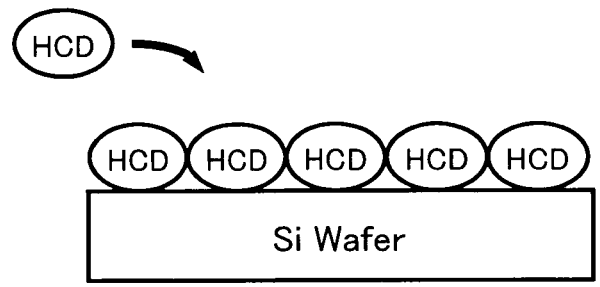
FIG. 10 is a schematic view showing the $SiO_2$ deposition model in the second sequence of this embodiment.
Figure 10:
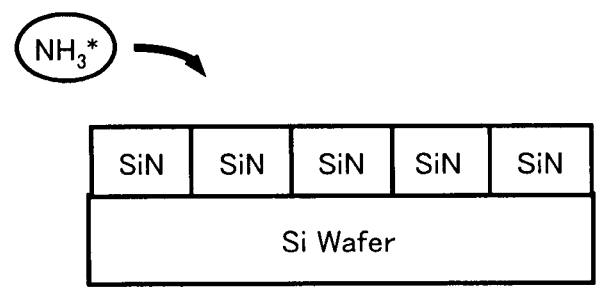
Figure 10:
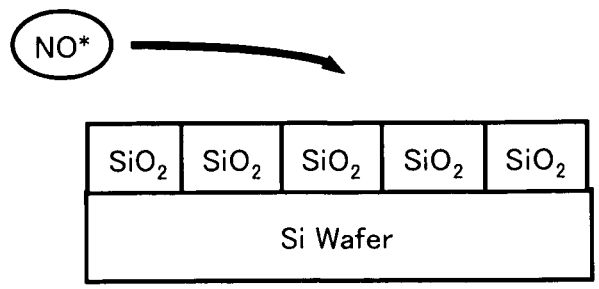

FIG. 9 shows the $SiO_2$ deposition model in the sequence of the conventional technique, and FIG. 10 shows the $SiO_2$ deposition model in the second sequence of this embodiment. Note that, either sequence shows a case in which the adsorption layer of the HCD, being a source, is formed on the surface of the silicon wafer in the first step.

In the case of the sequence of the conventional technique of FIG. 9, when the HCD gas as the source gas is first supplied, as shown in FIG. 9A, the HCD is adsorbed on the silicon wafer surface and the adsorption layer of the HCD is formed on the silicon wafer.

In this state, when the gas containing NO active species (NO*) obtained by exciting the NO gas by plasma is supplied, oxidation of HCD molecules adsorbed on the surface of the silicon wafer advances from the upper stream toward the lower stream of the NO gas (NO*) flow in the surface of the wafer, as shown in FIG. 9B. Meanwhile, the HCD molecules in the lower stream of the NO gas in the surface of the wafer are desorbed from the surface of the silicon wafer. This is because NO* obtained by exciting the NO gas by plasma has the energy of not only oxidizing the HCD molecules but also decoupling the Si—O bond and the Si—Si bond. Namely, in this case, fixation of Si onto the surface of the silicon wafer can not be sufficiently performed, and a region where Si is not fixed onto the surface of the silicon wafer is generated. Further, as shown in FIG. 9C, NO* also oxidizes the surface of the silicon wafer, being the foundation of the formed $SiO_2$ layer.

Accordingly, when the $SiO_2$ film is formed by the sequence of the conventional technique while rotating the silicon wafer, the film thickness of an outer periphery of the $SiO_2$ film increases, and the uniformity of the film thickness in the wafer surface is deteriorated (see FIG. 6). In addition, the HCD molecules desorbed from the surface of the silicon wafer flows to the lower stream in the processing chamber, and re-adsorbed on the wafer in the lower stream of the NO gas flow in the processing chamber, namely, in a lower part in a wafer arrangement region, and is oxidized. Therefore it is considered that the uniformity of the film thickness between wafers is also deteriorated.

Meanwhile, in a case of the second sequence of this embodiment in FIG. 10, when the HCD gas is first supplied, as shown in FIG. 10A, the HCD is adsorbed on the surface of the silicon wafer and the adsorption layer of the HCD is formed on the silicon wafer.

In this state, when the gas containing $NH_3$ active species ($NH_3$*) obtained by exciting $NH_3$ gas by plasma is supplied, as shown in FIG. 10B, nitridation of the HCD molecules adsorbed on the surface of the silicon wafer advances, from the upper stream toward the lower stream of the $NH_3$ gas ($NH_3$*) flow in the surface of the wafer. At this time, the HCD molecules in the lower stream of the $NH_3$ gas flow on the wafer surface is not desorbed from the surface of the silicon wafer. Namely, it is possible to restrain the desorption of the HCD molecules from the surface of the silicon wafer generated in the sequence of the conventional technique. This is because the energy of the $NH_3$* obtained by exciting the $NH_3$ gas by plasma is relatively low, then the Si—N bond is generated by a low energy compared with the Si—O bond, and it is considered that the HCD can be sufficiently nitrided even by such a low energy. Namely, in this case, Si can be fixed sufficiently onto the surface of the silicon wafer, and Si is uniformly fixed onto the surface of the silicon wafer. Accordingly, as shown in FIG. 10B, the HCD molecules adsorbed on the surface of the silicon wafer is nitrided uniformly over the wafer surface, and the SiN layer is formed on the surface of the silicon wafer uniformly over the wafer surface.

In this state, when the gas containing the NO active species (NO*) obtained by exciting the NO gas by plasma is supplied, the SiN layer formed on the surface of the silicon wafer is oxidized as shown in FIG. 10C. In order to oxidize this SiN layer, higher energy than the energy for oxidizing the HCD is necessary.

Therefore, less contribution is given by this energy (NO*'s energy) to decouple the Si—O bond and the Si—Si bond, and this energy is mainly used for a reaction of replacing nitrogen (N) with oxygen (O) in the SiN layer. Therefore, the SiN layer can be changed into the $SiO_2$ layer while maintaining the uniformity of the layer thickness in the wafer surface obtained once. Then, as a result, the excellent uniformity of the film thickness in the wafer surface of the $SiO_2$ film formed on the silicon wafer can be obtained (see FIG. 6). In addition, the bonding energy (about 3.7 eV) of the Si—N bond is higher than the bonding energy (about 2.0 eV) of the Si—Si bond. Therefore, the SiN layer exhibits an anti-oxidizing effect of the silicon wafer which is a foundation of the SiN layer. In addition, NO* not contributing to oxidation on the upper stream of the NO gas (NO*) flow is flown to the lower stream, and contribute to the oxidation of the SiN layer in a downstream part, and the uniformity of the film thickness is further progressed.

Note that the sequence of the conventional technique of FIG. 9 and the second sequence of this embodiment of FIG. 10 describe a case that the adsorption layer of the HCD is formed on the surface of the silicon wafer in the first step. However, the same thing can be said for a case that the HCD gas supplied in the first step is self-decomposed and the silicon layer is formed on the surface of the silicon wafer. In this case, similar description can be given, only if the HCD molecules of FIG. 9 and FIG. 10 are replaced with Si molecules.

Here, explanation is given for an example of changing the sequence of the aforementioned conventional technique, namely, an example of repeating formation of the silicon-containing layer on the wafer, formation of the oxide layer by oxidation of the silicon-containing layer, and nitridation of this oxide layer.

In a case of this example, in the same way as the sequence of the conventional technique, after the silicon-containing layer is formed on the wafer, this silicon-containing layer is oxidized. However, as described above, when the silicon-containing layer is oxidized and changed into the $SiO_2$ layer, the uniformity of the layer thickness in the wafer surface of this $SiO_2$ layer is deteriorated. Therefore, even if this $SiO_2$ layer is nitrided, the layer with excellent uniformity of the layer thickness can not be obtained. Namely, in the case of this example, it is difficult to form the film with excellent uniformity of the film thickness.

In the case of nitriding the $SiO_2$ layer, as described above, the Si—O bond has a higher bonding energy than the Si—N bond. Therefore, extremely high energy is required for changing the Si—O bond, which is formed once, into the Si—N bond. Then, in order to change the Si—O bond into the Si—N bond, first, the Si—O bond must be decoupled. However, the Si—O bond can not be easily decoupled by a thermal energy. For example, it is confirmed that the $SiO_2$ layer can not be nitrided even at a temperature of about 1000° C. Also, it is confirmed that nitrogen concentration in the $SiO_2$ film is not increased, even if the formation of the $SiO_2$ layer and plasma nitridation of the $SiO_2$ layer are repeated. Namely, it is found that extremely high energy is required for nitriding the $SiO_2$ layer and it is not easy to nitride the $SiO_2$ layer.

Second Example

Next, a second example will be described.

The silicon oxide film was formed by the second sequence of this embodiment and by a general CVD method, and the concentration of impurities in the film was measured. Note that the general CVD method is a method of forming the silicon oxide film (HTO (High Temperature Oxide) film) by the CVD method by supplying DCS and $N_2O$ simultaneously, and a film forming temperature was set at 780° C. Also, the film forming temperature in each step in the second sequence of this embodiment was set at 600° C. constantly, and the other film forming conditions (processing conditions in each step) were set in a range of the conditions described in the aforementioned embodiment. Measurement of the impurities in the film was performed by using SIMS.

Figure 11B:
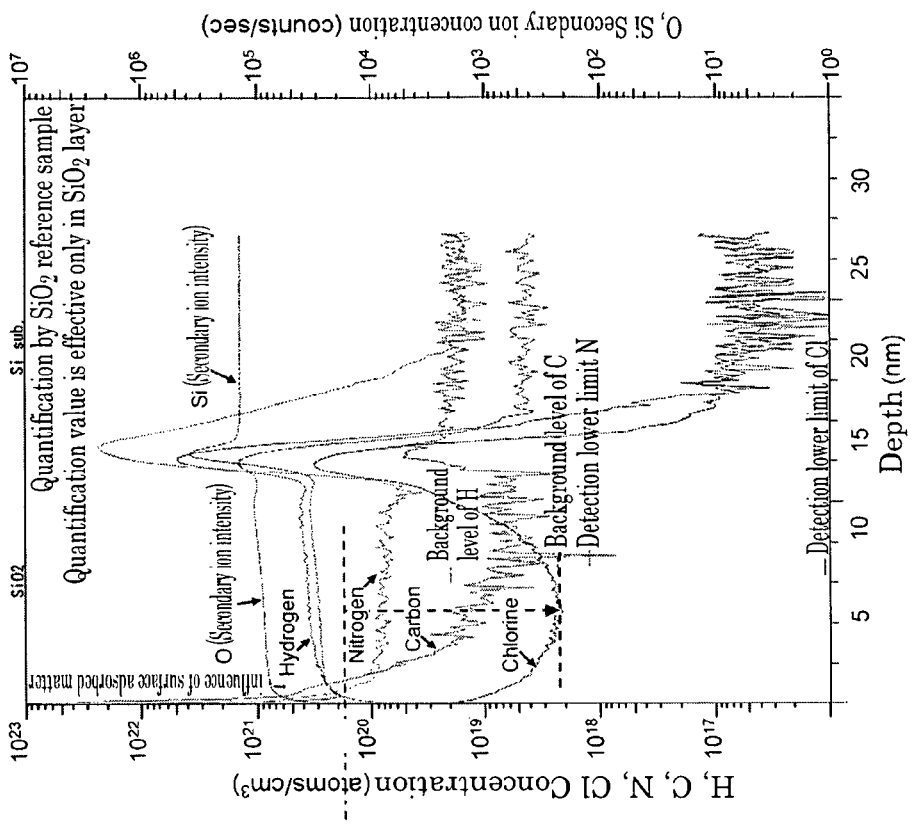
FIG. 11B is a graph chart showing the concentration of impurities (H, C, N, and Cl) in the film of the silicon oxide film formed by the second sequence of this embodiment.
Figure 11A:
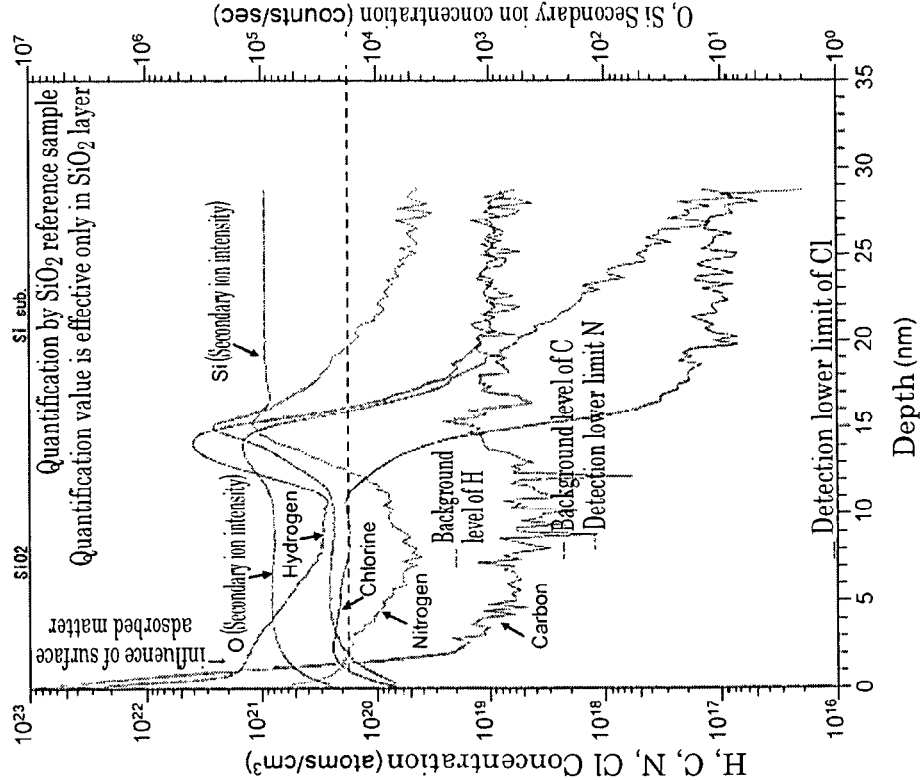
FIG. 11A is a graph chart showing the concentration of impurities (H, C, N, and Cl) in a film of a silicon oxide film formed by a common CVD method.

FIG. 11 shows the result. FIG. 11A shows the concentration of the impurities (H, C, N, Cl) contained in the film of the silicon oxide film formed by the general CVD method. FIG. 11B shows the concentration of the impurities (H, C, N, Cl) contained in the film of the silicon oxide film formed by the second sequence of this embodiment. In either figure, a depth (nm) from the surface of the $SiO_2$ film is indicated on the horizontal axis, and the concentration (atoms/cm$^3$) of the H, C, N, Cl is indicated on the vertical axis at the left side, and a secondary ion intensity (counts/sec) of O, Si is indicated on the vertical axis at the right side.

As shown in FIG. 11A and FIG. 11B, it is found that the concentration of C, N, H out of the impurities contained in the film of the silicon oxide film formed by the second sequence of this embodiment is equivalent to the concentration of C, N, H contained in the film of the silicon oxide film formed by the general CVD method. However, it is found that the concentration of Cl out of the impurities contained in the film of the silicon oxide film formed by the second sequence of this embodiment is lower by about two digits than the concentration of Cl contained in the film of the silicon oxide film formed by the general CVD method. Namely, it is found that the silicon oxide film formed by the second sequence of this embodiment has lower concentration of the impurities, particularly extremely lower concentration of Cl, than the silicon oxide film formed by the general CVD method. In addition, it is confirmed that the concentration of the impurities contained in the film of the silicon oxide film formed by the first sequence of this embodiment is also equivalent to the concentration in the second sequence. Namely, the silicon oxide film formed by the first sequence of this embodiment also has lower concentration of impurities, particularly extremely lower concentration of Cl, compared with the silicon oxide film formed by the general CVD method.

Figure 12:
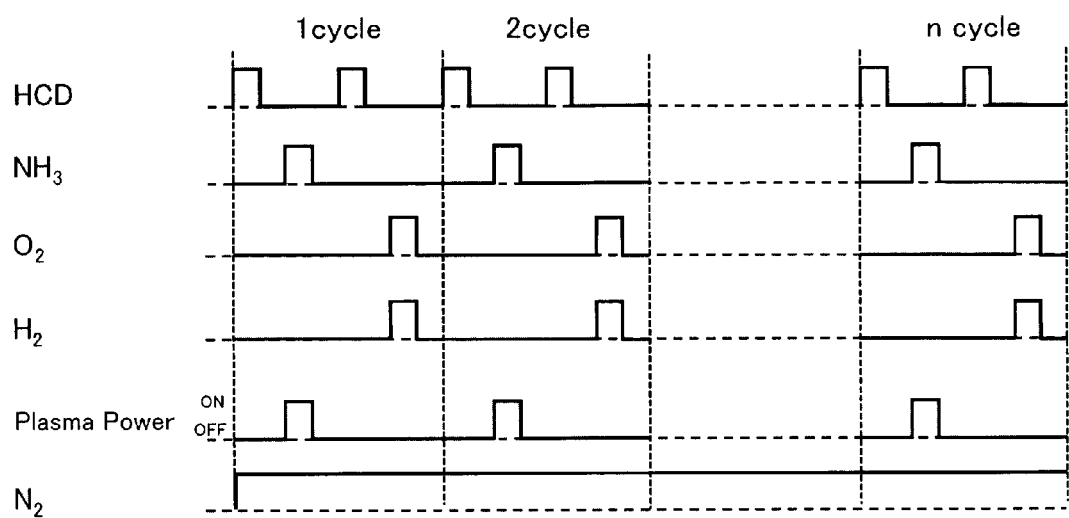
FIG. 12 is a view showing the timing of gas supply and plasma power supply in the first sequence of other embodiment.
Figure 13:
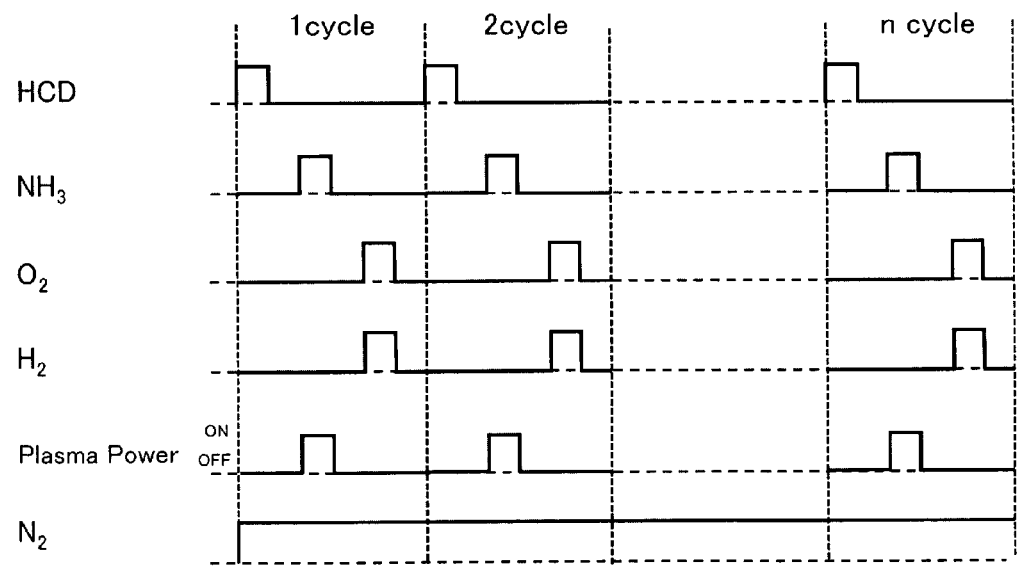
FIG. 13 is a view showing the timing of gas supply and plasma power supply in the second sequence of other embodiment.

Note that, in the aforementioned embodiment, explanation is given for an example of using the gas obtained by exciting NO by plasma as the activated gas containing 0, in the first sequence and the second sequence. Also, explanation is given for a case that the gas obtained by exciting $O_2$, $N_2O$, $N_2O_4$, etc, by plasma may also be used, other than the gas obtained by exciting NO by plasma, and $O_3$ may also be used as the activated gas containing O. Further, it is also possible to supply oxygen-containing gas and hydrogen-containing gas into a heated and vacuumed processing chamber as the activated gas containing O, and possible to use the gas obtained by activating these oxygen-containing gas and hydrogen-containing gas in a non-plasma state. In this case, the oxygen-containing gas and the hydrogen-containing gas supplied into the processing chamber are activated and reacted in the processing chamber in a heated and vacuumed atmosphere, thereby forming oxidizing species containing O such as atomic oxygen, and oxidation processing is performed by these oxidizing species. According to this oxidation processing, oxidizing power can be tremendously improved, compared with a case that the oxygen-containing gas is supplied singly. Namely, by adding the hydrogen-containing gas to the oxygen-containing gas in the vacuum atmosphere, it is possible to obtain an effect of considerably changing the oxidizing power, compared with a case of a single supply of the oxygen-containing gas. FIG. 12 and FIG. 13 respectively show timing charts of gas supply and plasma power supply in the first sequence and the second sequence of this case.

In the first sequence of FIG. 12, there are provided the step of forming the silicon-containing layer on the wafer by supplying the source gas containing silicon into the processing chamber in which the wafer is accommodated (step 1), the step of nitriding the silicon-containing layer and changing it into the silicon nitride layer by activating the gas containing nitrogen by plasma or heat and supplying this gas into the processing chamber (step 2), the step of forming the silicon-containing layer on the silicon nitride layer by supplying the source gas containing silicon into the processing chamber (step 3), and the step of oxidizing the silicon-containing layer formed on the silicon nitride layer and the silicon nitride layer and changing these layers into the silicon oxide layer by supplying the oxygen-containing gas and the hydrogen-containing gas into the heated and vacuumed processing chamber (step 4), with this cycle set as one cycle and performed for at least one or more times.

In the second sequence of FIG. 13, there are provided the step of forming the silicon-containing layer on the wafer by supplying the source gas containing silicon into the processing chamber in which the wafer is accommodated (step 1), the step of nitriding the silicon-containing layer and changing it into the silicon nitride layer by activating the gas containing nitrogen by plasma or heat and supplying this gas into the processing chamber (step 2), and the step of oxidizing the silicon nitride layer and changing it into the silicon oxide layer by supplying the oxygen-containing gas and the hydrogen-containing gas into the heated and vacuumed processing chamber (step 3), with this cycle set as one cycle and performed for at least one or more times.

In this case, at least one gas selected from the group consisting of oxygen ($O_2$) gas and ozone ($O_3$) gas can be used as the oxygen-containing gas, and at least one gas selected from the group consisting of hydrogen ($H_2$) gas, ammonia ($NH_3$) gas and methane ($CH_4$) gas can be used as the hydrogen-containing gas.

Note that each case of FIG. 12 and FIG. 13 shows an example of a case that the source gas is the HCD gas, the gas containing nitrogen is the $NH_3$ gas, the oxygen-containing gas is the $O_2$ gas, and the hydrogen-containing gas is the $H_2$ gas.

When the oxidation processing is performed by supplying the oxygen-containing gas (such as $O_2$ gas) and the hydrogen-containing gas (such as $H_2$ gas) into the heated and vacuumed processing chamber, the pressure in the processing chamber is set to be lower than the atmospheric pressure, such as the pressure within a range of 1 to 1000 Pa. The supply flow rate of the $O_2$ gas is set, for example within a range of 1 to 20000 sccm, and the supply flow rate of the $H_2$ gas is set, for example within a range of 1 to 20000 sccm. The time for exposing the wafer to the oxidizing species obtained by a reaction between the $O_2$ gas and the $H_2$ gas is set, for example within a range of 2 to 120 seconds. The temperature of the heater at this time is set, for example within a range of 350 to 1000° C. It was confirmed that when the temperature was set within this range, the effect of changing the oxidizing power by adding the $H_2$ gas to the $O_2$ gas in a vacuum atmosphere could be obtained. Also, it was confirmed that when the temperature of the wafer was excessively low, the effect of changing the oxidizing power could not be obtained. However, when throughput is taken into consideration, it is preferable to set the temperature of the heater, so that the temperature of the wafer for oxidation processing is the same as the temperature for forming the silicon-containing layer or for nitriding processing, namely so that the temperature in the processing chamber is maintained to be the same as the temperature for forming the silicon-containing layer or for nitriding processing. In this case, in the first sequence, the temperature of the heater is set in the step 1 to step 4, so that the temperature of the wafer, namely the temperature in the processing chamber is set to be constantly within a range of 350 to 650° C. in the processing chamber. In the second sequence, the temperature of the heater is set in step 1 to step 3, so that the temperature in the processing chamber is set to be constantly within a range of 350 to 650° C. in the processing chamber. Note that in order to obtain the effect of changing the oxidizing power by adding the $H_2$ gas to the $O_2$ gas in the vacuum atmosphere, the temperature in the processing chamber must be set to be 350° C. or more. However, the temperature in the processing chamber is preferably set to be 400° C. or more, and further preferably set to be 450° C. or more. When the temperature in the processing chamber is set to be 400° C. or more, it is possible to obtain the oxidizing power exceeding the oxidizing power by $O_3$ oxidation processing performed at the temperature of 400° C. or more, and when the temperature in the processing chamber 201 is set to be 450° C. or more, it is possible to obtain the oxidizing power exceeding the oxidizing power by plasma oxidation processing performed at the temperature of 450° C. or more.

In the first sequence, the oxidizing species obtained by the reaction between the $O_2$ gas and the $H_2$ gas causes surface reaction with the silicon-containing layer formed in step 3 and with the silicon nitride layer formed in step 2 which is the foundation of the silicon-containing layer. Then, both the silicon-containing layer and the silicon nitride layer are oxidized by the oxidizing species and changed into the silicon oxide layer. In the second sequence, the oxidizing species obtained by the reaction between the $O_2$ gas and the $H_2$ gas causes surface reaction with the silicon nitride layer formed in step 2, and the silicon nitride layer is oxidized by its oxidizing species and changed into the silicon oxide layer.

Note that when the oxidation processing by adding the $H_2$ gas to the $O_2$ gas in the vacuum atmosphere (hereinafter, also referred to as vacuum oxidation processing), the $O_2$ plasma-oxidation processing, and the $O_3$ oxidation processing were compared, it was confirmed that the oxidizing power of the vacuum oxidation processing was strongest in a low-temperature atmosphere at 450° C. or more and 650° C. or less. Exactly, it was confirmed that the oxidizing power by the vacuum oxidation processing exceeded the oxidizing power by the $O_3$ oxidation processing at 400° C. or more and 650° C. or less, and the oxidizing power by the vacuum oxidation processing exceeded the oxidizing power by the $O_3$ oxidation processing and the $O_2$ plasma oxidation processing at 450° C. or more and 650° C. or less. Thus, it is found that this vacuum oxidation processing is extremely effective in such a low temperature atmosphere. However, in the vacuum oxidation processing, there is also an alternative of the oxygen-containing gas, such as using $O_3$ and $O_2$ plasma, and use of these gases is not denied. Effects that can be considered is that by adding the hydrogen-containing gas to the $O_3$ and $O_2$ plasma, the oxidizing species with higher energy can be generated, and by performing the oxidation processing by this oxidizing species, device characteristics would be improved.

Figure 14:
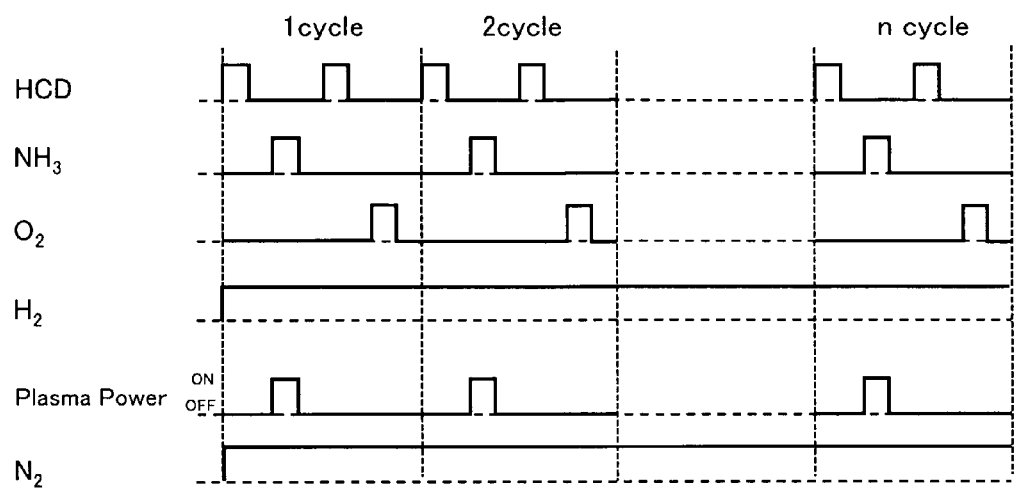
FIG. 14 is a view showing the timing of gas supply and plasma power supply in the first sequence of other embodiment when $H_2$ gas is flown continuously.
Figure 15:
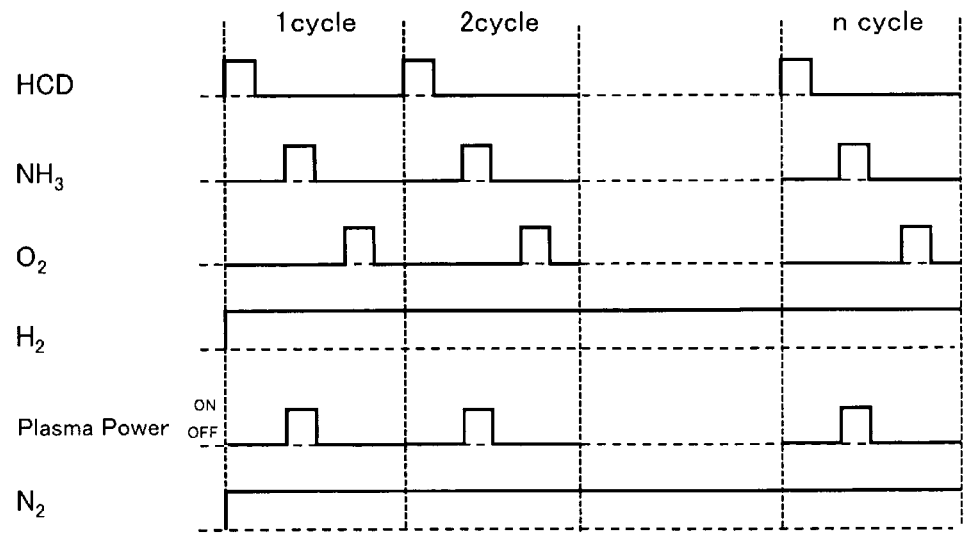
FIG. 15 is a view showing the timing of gas supply and plasma power supply in the second sequence of other embodiment when $H_2$ gas is flown continuously.

The $H_2$ gas, as the hydrogen-containing gas used in the vacuum oxidation processing, may be supplied intermittently, that is, only for the oxidation processing, as shown in FIGS. 12 and 13. Alternatively, the $H_2$ gas may be supplied continuously, that is, at all times while each step is repeated, as shown in FIGS. 14 and 15. Note that, FIGS. 14 and 15 respectively show the timing charts for gas supply and plasma power supply in the first sequence and in the second sequence, when the $H_2$ gas is flown continuously.

In addition, even when the $H_2$ gas is intermittently supplied, the $H_2$ gas may be supplied only for forming the silicon-containing layer and for the oxidation processing, in addition to supplying the $H_2$ gas only for the oxidation processing. Also, the $H_2$ gas may be supplied only before the oxidation processing and during the oxidation processing, and also may be supplied during the oxidation processing and after the oxidation processing. Also, the $H_2$ gas may be supplied before the oxidation processing and after the oxidation processing.

By supplying the $H_2$ gas during forming the silicon-containing layer, namely during supplying the HCD gas, Cl in the HCD gas would be extracted, and effects such as changing the film forming rate and reducing Cl impurity in the film can be obtained. In addition, by starting to supply the $H_2$ gas before the oxidation processing, namely after stop of the supply of the HCD gas or after stop of the supply of the $NH_3$ gas and prior to the $O_2$ gas, the uniformity of the film thickness could be effectively controlled. Also, by starting to supply the $H_2$ gas prior to the $O_2$ gas, the oxide film could be selectively formed in the silicon, for example at a part where metal and silicon are exposed. Also, by supplying the $H_2$ gas after the oxidation processing, namely after stopping the supply of the $O_2$ gas, and before starting the supply of the HCD gas, the surface of the SiO layer formed by the oxidation processing is terminated by hydrogen and modified, and the HCD gas supplied during forming the silicon-containing layer at the next time would be easily adsorbed on the surface of the SiO layer.

Third Example

Next, a third example will be described.

The silicon oxide film (SiO film) was formed by the sequence of FIG. 13, and the uniformity of the film thickness distribution in the wafer surface of this silicon oxide film and the film forming rate were measured. The temperature of the wafer in steps 1 to 3 was maintained to 600° C., and the other film forming conditions (processing conditions in each step) were set in a range of the conditions described in the aforementioned embodiments, etc.

When an SiO film was formed on the wafer as described above, the uniformity of the film thickness distribution in the wafer surface of the formed SiO film is about ±0.8%, and the film forming rate at that time was about 1.6 Å/cycle. It was confirmed that either of the uniformity of the film thickness distribution and the film forming rate were excellent and they were equivalent to the uniformity of the film thickness distribution and the film forming rate of the SiO film formed by the second sequence of the aforementioned embodiment. In addition, it was also confirmed that the uniformity of film thickness distribution and the film forming rate of the SiO film formed by the sequence in FIG. 12 were equivalent to the uniformity of the film thickness distribution and the film forming rate of the SiO film formed by the first sequence in the aforementioned embodiment.

Note that, the aforementioned embodiment describes an example of forming the Si-containing layer in step 1 of the first sequence and the second sequence, and in step 3 of the first sequence, and forming the SiO film finally. However, it is also preferable that the layer containing metal elements such as Ti, Al, Hf, etc, instead of the Si-containing layer (layer containing semiconductor elements) is formed, and a metal oxide film is formed finally. For example, when the TiO film is formed in a case of the first sequence, it can be considered that a Ti-containing layer (adsorption layer of a Ti source or Ti layer) is formed on the wafer in step 1, and the Ti-containing layer is changed into a TiN layer in step 2, then the Ti-containing layer is formed on the TiN layer in step 3, and the Ti-containing layer/TiN layer are changed into the TiO layer in step 4. In a case of the second sequence, it can be also considered that the Ti-containing layer is formed on the wafer in step 1, then the Ti-containing layer is changed into the TiN layer in step 2, and the TiN layer is changed into the TiO layer in step 3. The same thing can be said for a case of forming an AlO film and an HfO film. Thus, the present invention can be applied not only to a case that the specific element is the semiconductor element, but also to the case that the specific element is a metal element.

Figure 7:
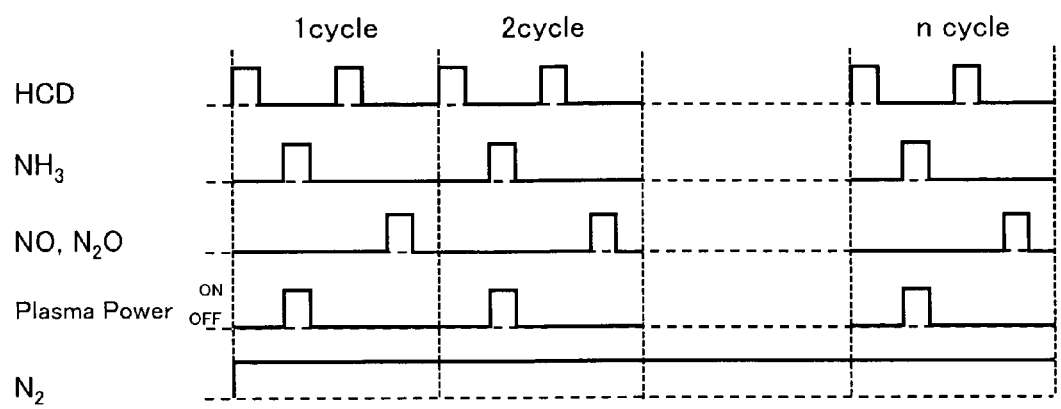
FIG. 7 is a view showing the timing of gas supply and plasma power supply in the first sequence of other embodiment.
Figure 8:
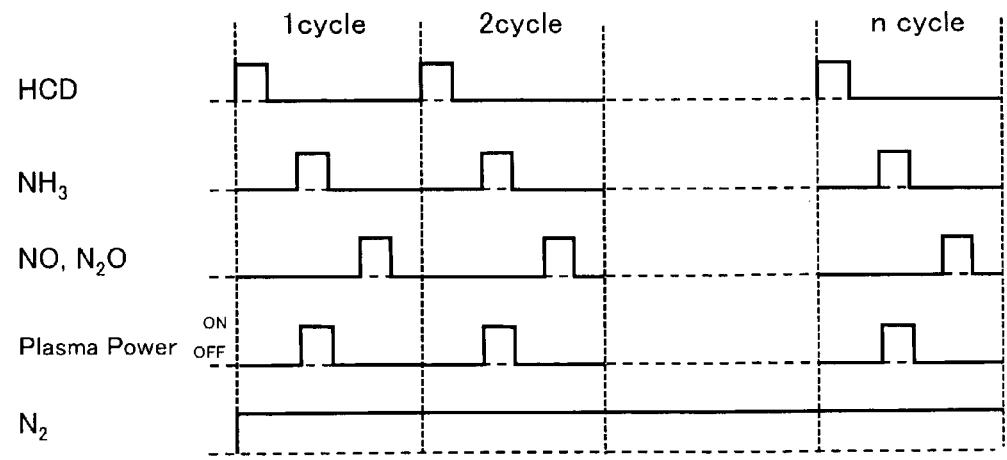
FIG. 8 is a view showing the timing of gas supply and plasma power supply in the second sequence of other embodiment.

The aforementioned embodiment describes an example of changing the SiN layer, etc, into the $SiO_2$ layer, by activating the gas containing oxygen by plasma and supplying this gas in step 4 of the first sequence and in step 3 of the second sequence. However, it is also possible that by controlling (restraining) an activation amount (degree) of the gas containing oxygen, thereby restraining the oxidizing power, the SiN layer, etc, is changed into the SiON layer, without completely changing the SiN layer into the $SiO_2$ layer. For example, by activating the gas containing oxygen by not plasma but by heat, the SiN layer, etc, can be changed into the SiON layer. FIGS. 7 and 8 respectively show the timing chart of the gas supply and plasma power supply in the first sequence and the second sequence of this case.

In the first sequence of FIG. 7, there are provided a first step of forming a specific element-containing layer (adsorption layer of a source or a layer of the specific element) on the substrate by supplying the source gas containing the specific element and supplying this gas to the substrate (step 1), a second step of changing the specific element-containing layer into the nitride layer by activating the gas containing nitrogen by plasma or heat and supplying this gas to the specific element-containing layer (step 2), a third step of forming the specific element-containing layer on the nitride layer by supplying the source gas to the nitride layer (step 3), and a fourth step of changing the specific element-containing layer formed on the nitride layer and the nitride layer into an oxynitride layer by activating the gas containing oxygen by heat and supplying this gas to the specific element-containing layer formed on the nitride layer (step 4), with this cycle set as one cycle and performed for at least one or more times under the condition that ALD reaction or CVD reaction occurs. Thus, the oxynitride film of a desired film thickness is formed. In the first step, the specific element-containing layer from under one atomic layer to several atomic layers is formed on the substrate, in the second step, this specific element-containing layer is changed into the nitride layer, in the third step, the specific element-containing layer from under one atomic layer to several atomic layers is formed on the nitride layer, and in the fourth step, both the specific element-containing layer and the nitride layer which is the foundation of the specific element-containing layer are changed into the oxynitride layer.

In the second sequence of FIG. 8, there are provided a first step of forming the specific element-containing layer on the substrate by supplying the source gas containing the specific element to the substrate (step 1), a second step of changing the specific element-containing layer into the nitride layer by activating the gas containing nitrogen by plasma or heat and supplying this gas to the specific element-containing layer (step 2), and a third step of changing the nitride layer into the oxynitride layer by activating the gas containing oxygen by heat and supplying this gas to the nitride layer (step 3), with this cycle set as one cycle, and performed for at least one or more times under the condition that ALD reaction or CVD reaction occurs. Thus, the oxynitride film of a desired film thickness is formed. In the first step, the specific element-containing layer from under one atomic layer to several atomic layers is formed on the substrate, in the second step, the specific element-containing layer is changed into the nitride layer, and in the third step, the nitride layer is change into the oxynitride layer. Note that either of FIGS. 7 and 8 shows an example of a case that the specific element is Si, the source gas is the HCD gas, the gas containing nitrogen is the $NH_3$ gas, and the gas containing oxygen is the NO gas or the $N_2O$ gas. In this case, the specific element-containing layer is the silicon-containing layer, the nitride layer is the silicon nitride layer (SiN layer), the oxynitride layer is the silicon oxynitride layer (SiON layer), and the oxynitride film is a silicon oxynitride film (SiON film).

As shown in FIGS. 7 and 8, when the SiN layer, etc, is changed into the SiON layer by activating the gas containing oxygen not by plasma but by heat (in a state of non-plasma), the NO gas, with the flow rate adjusted by the first mass flow controller 241a, is jetted into the buffer chamber 237 from the second gas supply holes 248b of the gas nozzle 233, from the first gas supply tube 232a by opening both the first valve 243a of the first gas supply tube 232a and the fourth valve 243d of the gas exhaust tube 231, in step 4 of the first sequence and step 3 of the second sequence. At this time, plasma is not generated by not applying high frequency electric power between the first rod electrode 269 and the second rod electrode 270, and the NO gas is excited by heat in a heated region by the heater 207 and is exhausted from the gas exhaust tube 231 while being supplied into the processing chamber 201 from the first gas supply holes 248a as the activated gas containing active species. When the NO gas is excited by heat and flown as the activated gas containing the active species, the fourth valve 243d is appropriately adjusted and the pressure in the processing chamber 201 is set to be, for example within a range of 10 to 5000 Pa. The supply flow rate of the NO gas controlled by the first mass flow controller 241a is set to be, for example within a range of 100 to 10000 sccm. The time required for exposing the wafer 200 to the activated gas containing the active species obtained by exciting the NO gas by heat is set to be, for example within a range of 2 to 120 seconds. In the same way as a supply time of the HCD gas, the temperature of the heater 207 at this time is set to be the temperature, so that the temperature of the wafer 200 is set to be the temperature within a range of 300 to 650° C. The NO gas has a high reaction temperature and hardly causes reaction at the aforementioned wafer temperature. Therefore, when the NO gas is excited by heat, an activation amount (degree) of the NO gas is more restrained than a case of exciting it by plasma, with extremely less amount of the generated active species. Thus, the amount of oxidation of SiN layer, etc, can be restrained. Note that when the NO gas is excited by heat, preferably the pressure in the processing chamber 201 is set higher than a case of exciting it by plasma.

When the activated gas containing the active species obtained by exciting the NO gas by heat is flown into the processing chamber 201, neither HCD gas nor $NH_3$ gas is flown into the processing chamber 201. Accordingly, the NO gas causes no vapor phase reaction, and in the first sequence, the activated NO gas containing the active species causes a surface reaction with the silicon-containing layer formed in step 3 and the silicon nitride layer (SiN layer) formed in step 2, being the foundation of the silicon-containing layer, and both the silicon layer and the silicon nitride layer are oxidized and changed into the silicon oxynitride layer (SiON layer). In the second sequence, the activated NO gas causes surface reaction with the silicon nitride layer (SiN layer) formed in step 2, and the silicon nitride layer is oxidized and changed into the silicon oxynitride layer (SiON layer). Note that when vacuum oxidation processing is performed, preferably the pressure in the processing chamber is set higher than a case of performing oxidation processing by using plasma.

By performing a changing step of changing the silicon nitride layer and the silicon-containing layer into the silicon oxynitride layer by using the NO gas activated by heat in step 4 in the first sequence of FIG. 7, and by performing the changing step of changing the silicon nitride layer into the silicon oxynitride layer by using the NO gas activated by heat in step 3 in the second sequence of FIG. 8, the Si—N, Si—Cl, Si—H bonds contained in the silicon nitride layer and the silicon-containing layer are partially decoupled by the energy of the NO gas activated by heat. The energy for forming the Si—O bond is higher than the bonding energy of Si—N, Si—Cl, Si—H, and therefore by adding the energy required for forming the Si—O bond to the silicon nitride layer and the silicon-containing layer subjected to oxidation processing, the Si—N, Si—Cl, Si—H bonds in the silicon nitride layer and the silicon-containing layer are partially decoupled. Note that the NO gas activated by heat has less activation amount (degree), and less amount of generated active species than the NO gas activated by plasma. Namely, the energy of the NO gas activated by heat is lower than the energy of the NO gas activated by plasma, and therefore all of the Si—N bonds contained in the silicon nitride layer and the silicon-containing layer are not decoupled, and the Si—N bonds are partially remained without being decoupled. N, H, Cl, in a state of decoupling the bonding with Si, are removed from the layer, and exhausted as $N_2$, $H_2$, $Cl_2$, and HCl, etc. Also, the excess bonding hands of Si as a result of decoupling the bond with N, H, Cl, are coupled with O contained in the activated NO gas, and the layer is changed into the SiON layer. It was confirmed that the SiON film formed by this technique was an excellent film, with extremely low concentration of hydrogen and chlorine in the film.

Note that FIG. 7 and FIG. 8 describe an example of performing oxidation processing in a state of non-plasma by using the NO gas or the $N_2O$ gas. However, in the same way as the aforementioned embodiments, it may also be preferable to use the aforementioned vacuum oxidation processing as the oxidation processing. In this case, the SiN layer, etc, is changed into the SiON layer, by setting the oxidation processing condition in the aforementioned vacuum oxidation processing, so that the amount of oxidizing species obtained by a reaction of the $O_2$ gas and the $H_2$ gas is reduced, thereby restraining the oxidizing power. FIGS. 7 and 8 describe an example of a case that the specific element is Si as a semiconductor element. However, in the same way as the aforementioned embodiment, the specific elements may be metal elements such as Ti, Al, and Hf, etc.

Fourth Example

Next, a fourth example will be described.

By activating the NO gas by heat in step 3 of the second sequence of this embodiment and supplying this gas, the silicon oxynitride film (SiON film) was formed, and a refractive index, the uniformity of the film thickness distribution in the wafer surface, and the film forming rate of this silicon oxynitride film were measured. The film forming conditions (processing conditions in each step) were set within the conditions described in the aforementioned embodiment, etc.

The refractive index of the film was set as an index. Then, the refractive index of the $SiO_2$ film was set at 1.48, the refractive index of the $Si_3N_4$ film was set at 2.00, and the refractive index of the SiON film was set at beyond 1.48 and under 2.00, and the processing conditions in each step (for example step 3) were variously changed within a range of the conditions described in the aforementioned embodiment, etc, to thereby change the refractive index of the formed film. As a result, by controlling the processing conditions in each step, it was confirmed that the refractive index of the formed film could be controlled to any value between 1.48 and 2.00, and the uniformity of the film thickness distribution in the wafer surface at this time could be controlled to ±1.5% or less. Also, it was confirmed that the film forming rate of the SiON film was higher when the refractive index was close to the refractive index (2.00) of the $Si_3N_4$ film, and was lower when the refractive index was close to the refractive index (1.48) of the $SiO_2$ film.

In addition, when the film was formed, with the wafer temperature in steps 1 to 3 maintained at 630° C., the SiON film having the refractive index of about 1.65 was formed. The uniformity of the film thickness distribution in the wafer surface at this time was about ±0.4% and this is excellent, and the uniformity of the film thickness distribution between wafers was about ±0.5 and this is also excellent. Also, the uniformity of the refractive index in the wafer surface at this time was about ±0.1% and this is excellent, and the uniformity of the refractive index between wafers was about ±0.01% and this is also excellent. The film forming rate at this time was about 1.5 A/cycle.

Note that when the gas containing oxygen is activated by plasma and this gas is supplied, after executing one cycle of formation of the SiN layer, namely after changing the Si-containing layer into the SiN layer, most of the SiN layer is reformed to the $SiO_2$ layer, due to strong oxidizing power. In this case, when the oxidizing power was decreased, by decreasing the high frequency electric power applied between the first rod electrode 269 and the second rod electrode 270, increasing the pressure in the processing chamber 201, or shortening a flow time of the NO gas, it was found that although the SiON layer was formed, difference in the distribution of Si, O, N in the SiON layer was generated between the outer peripheral part and the inside of wafer 200, thus making it impossible to uniformly form the SiON layer. Note that it would be possible to form the SiON film even when the gas containing oxygen is activated by plasma and this gas is supplied, if the thickness of the SiN layer to be oxidized is increased by a method such as increasing the number of cycles of forming the SiN layer. However, in this case, difference in concentration of Si, O, N would be generated in a depth direction. Therefore, when the SiN layer is changed into the SiON layer, the gas containing oxygen activated by not plasma but by heat is preferably used, to obtain the SiON film having uniform distribution of the concentration in the surface of Si, O, N and uniform distribution of the concentration in the depth direction thereof.

Preferred aspects of the present invention will be additionally described.

According to one aspect of the present invention, there is provided a method for manufacturing a semiconductor device, including the steps of:

forming a specific element-containing layer on a substrate by supplying source gas containing a specific element into a processing container in which the substrate is accommodated;

changing the specific element-containing layer into a nitride layer, by activating and supplying gas containing nitrogen into the processing container; and changing the nitride layer into an oxide layer or an oxynitride layer, by activating and supplying gas containing oxygen into the processing container;

with this cycle set as one cycle and performed for at least one or more times.

Preferably, the nitride layer is changed into the oxide layer by activating the gas containing oxygen by plasma and supplying this gas into the processing container, in the step of changing the nitride layer into the oxide layer or the oxynitride layer.

Also preferably, the nitride layer is changed into the oxynitride layer by activating the gas containing oxygen by heat and supplying this gas into the processing container, in the step of changing the nitride layer into the oxide layer or the oxynitirde layer.

According to another aspect of the present invention, there is provided a method for manufacturing a semiconductor device, including the steps of:

forming a silicon-containing layer on a substrate by supplying source gas containing silicon into a processing container in which the substrate is accommodated;

changing the silicon-containing layer into a silicon nitride layer, by activating and supplying gas containing nitrogen into the processing container; and changing the silicon nitride layer into a silicon oxide layer or a silicon oxynitride layer, by activating and supplying gas containing oxygen into the processing container;

with this cycle set as one cycle and performed for at least one or more times.

According to still another aspect of the present invention, there is provided a method for manufacturing a semiconductor device, including the steps of:

forming a specific element-containing layer on a substrate by supplying source gas containing a specific element into a processing container in which the substrate is accommodated;

changing the specific element-containing layer into a nitride layer, by activating and supplying gas containing nitrogen into the processing container;

forming the specific element-containing layer on the nitride layer by supplying the source gas into the processing container; and changing the specific element-containing layer formed on the nitride layer and the nitride layer into an oxide layer or an oxynitride layer, by activating and supplying gas containing oxygen into the processing container;

with this cycle set as one cycle and performed for at least one or more times.

According to still another aspect of the present invention, there is provided a method for manufacturing a semiconductor device, including the steps of:

forming a silicon-containing layer on a substrate by supplying gas containing silicon into a processing container in which the substrate is accommodated;

changing the silicon-containing layer into a silicon nitride layer, by activating and supplying gas containing nitrogen into the processing container;

forming the silicon-containing layer on the silicon nitride layer by supplying the gas containing silicon into the processing container; and changing the silicon-containing layer formed on the silicon nitride layer and the silicon nitride layer into a silicon oxide layer or a silicon oxynitride layer, by activating and supplying gas containing oxygen into the processing container;

with this cycle set as one cycle and performed for at least one or more times.

According to still another aspect of the present invention, there is provided a substrate processing apparatus including:

a processing container configured to accommodate a substrate;

a source gas supply system configured to supply source gas containing a specific element into the processing container;

a nitrogen-containing gas supply system configured to supply gas containing nitrogen into the processing container;

an oxygen-containing gas supply system configured to supply gas containing oxygen into the processing container;

an activating mechanism configured to activate the gas containing nitrogen and the gas containing oxygen; and a controller configured to control the source gas supply system, the nitrogen-containing gas supply system, the oxygen-containing gas supply system, and the activating mechanism, so that a specific element-containing layer is formed on the substrate by supplying the source gas into the processing container in which the substrate is accommodated, then the specific element-containing layer is changed into a nitride layer, by activating and supplying the gas containing nitrogen into the processing container, and the nitride layer is changed into an oxide layer or an oxynitride layer, by activating and supplying the gas containing oxygen into the processing container, with this cycle set as one cycle and performed for at least one or more times.

According to a still another aspect of the present invention, there is provided a substrate processing apparatus including:

a processing container configured to accommodate a substrate;

a source gas supply system configured to supply source gas containing a specific element into the processing container;

a nitrogen-containing gas supply system configured to supply gas containing nitrogen into the processing container;

an oxygen-containing gas supply system configured to supply gas containing oxygen into the processing container;

an activating mechanism configured to activate the gas containing nitrogen and the gas containing oxygen; and a controller configured to control the source gas supply system, the nitrogen-containing gas supply system, the oxygen-containing gas supply system, and the activating mechanism, so that a specific element-containing layer is formed on the substrate by supplying the source gas into the processing container in which the substrate is accommodated, then the specific element-containing layer is changed into a nitride layer, by activating and supplying the gas containing nitrogen into the processing container, and the specific element-containing layer is formed on the nitride layer by supplying the source gas into the processing container, and the specific element-containing layer formed on the nitride layer and the nitride layer are changed into an oxide layer or an oxynitride layer, by activating and supplying the gas containing oxygen into the processing container, with this cycle set as one cycle and performed for at least one or more times.

According to still another aspect of the present invention, there is provided a method for manufacturing a semiconductor device, including:

a first step of forming a first thin film containing a first element on a substrate;

a second step of changing the first thin film into a second thin film containing the first element and a second element; and a third step of changing the second thin film into a third thin film containing the first element and the third element, with this cycle set as one cycle and performed for at least one or more times.

Preferably, the second element is nitrogen (N), the second thin film is a nitride film, the third element is oxygen (O), and the third thin film is an oxide film.

Also preferably, the first element is silicon (Si), the first thin film is a silicon film, the second element is nitrogen (N), the second thin film is a silicon nitride film, the third element is oxygen (O), and the third thin film is a silicon oxide film.

Also preferably, the second element is nitrogen (N), the second thin film is a nitride film, the third element is oxygen (O), and the third thin film is an oxynitride film.

Also preferably, the first element is silicon (Si), the first thin film is a silicon film, the second element is nitrogen (N), the second thin film is a silicon nitride film, the third element is oxygen (O), and the third thin film is a silicon oxynitride film.

Also preferably, nitriding processing is performed by activating gas containing nitrogen and supplying this gas to the first thin film in the second step, and oxidation processing is performed by activating gas containing oxygen and supplying this gas to the second thin film in the third step.

Also preferably, gas containing nitrogen is activated by plasma or heat and supplied to the first thin film in the second step, and gas containing oxygen is activated by plasma and supplied to the second thin film in the third step.

Also preferably, gas containing nitrogen is activated by plasma or heat and supplied to the first thin film in the second step, and gas containing oxygen is activated by heat and supplied to the second thin film.

According to still another aspect of the present invention, there is provided a method for manufacturing a semiconductor device, including a first step of forming a first thin film containing a first element on a substrate; a second step of changing the first thin film into a second thin film containing the first element and a second element; a third step of forming the first thin film on the second thin film; and a fourth step of changing the first thin film formed on the second thin film and the second thin film into a third thin film containing the first element and a third element, with this cycle set as one cycle and performed for at least one or more times.

Preferably, the second element is nitrogen (N), the second thin film is a nitride film, the third element is oxygen (O), and the third thin film is an oxide film.

Also preferably, the first element is silicon (Si), the first thin film is a silicon film, the second element is nitrogen (N), the second thin film is a silicon nitride film, the third element is oxygen (O), and the third thin film is a silicon oxide film.

Also preferably, the second element is nitrogen (N), the second thin film is a nitride film, the third element is oxygen (O), and the third thin film is an oxynitride film.

Also preferably, the first element is silicon (Si), the first thin film is a silicon film, the second element is nitrogen (N), the second thin film is a silicon nitride film, the third element is oxygen (O), and the third thin film is a silicon oxynitride film.

Also preferably, nitridation processing is performed by activating gas containing nitrogen and supplying this gas to the first thin film in the second step, and oxidation processing is performed by activating gas containing oxygen and supplying this gas to the first thin film formed on the second thin film in the fourth step.

Also preferably, gas containing nitrogen is activated by plasma or heat and supplied to the first thin film in the second step, and gas containing oxygen is activated by plasma and supplied to the first thin film formed on the second thin film in the fourth step.

Also preferably, gas containing nitrogen is activated by plasma or heat and supplied to the first thin film in the second step, and gas containing oxygen is activated by heat and supplied to the first thin film formed on the second thin film in the fourth step.

According to still another aspect of the present invention, there is provided a method for manufacturing a semiconductor device, including a first step of forming a thin film on a substrate by supplying source gas to a substrate; a second step of changing the thin film into a nitride film by activating gas containing nitrogen by plasma or heat and supplying this gas to the thin film; a third step of changing the nitride film into an oxide film by activating the gas containing oxygen by plasma and supplying this gas to the nitride film, with this cycle set as one cycle and performed for at least one or more times.

Preferably, the thin film is a silicon film, and in the third step, at least any one of the Si—N, Si—Cl, Si—H bonds contained in the nitride film is excited to decouple this bond, so that N, Cl, H are removed from a film, and by making O coupled with Si having excess bonding hands, the nitride film is changed into the oxynitride film.

According to still another aspect of the present invention, there is provided a method for manufacturing a semiconductor device, including a first step of forming a thin film on a substrate by supplying source gas to the substrate; a second step of changing the thin film into a nitride film by activating the gas containing nitrogen by plasma or heat and supplying this gas to the thin film; and a third step of changing the nitride film into an oxynitride film by activating the gas containing oxygen by heat and supplying this gas to the nitride film, with this cycle set as one cycle and performed for at least one or more times.

Preferably, the thin film is a silicon film, and in the third step, at least any one of the Si—N, Si—Cl, Si—H bonds contained in the nitride film is excited to decouple this bond, so that N. Cl, H are removed from a film, and by making O coupled with Si having excess bonding hands, the nitride film is changed into the oxynitride film.

According to a still another aspect of the present invention, there is provided a method for manufacturing a semiconductor device, including a first step of forming a thin film on a substrate by supplying source gas to a substrate; a second step of changing the thin film into a nitride film by activating gas containing nitrogen by plasma or heat and supplying this gas to the thin film; a third step of forming the thin film on the nitride film by supplying the source gas to the nitride film; and a fourth step of changing the thin film formed on the nitride film and the nitride film into an oxide film by activating gas containing oxygen by plasma and supplying this gas to the thin film formed on the nitride film, with this cycle set as one cycle and performed for at least one or more times.

Preferably, the thin film is a silicon film, and in the fourth step, at least any one of Si—N, Si—Cl, Si—H bonds contained in the nitride film is excited to decouple this bond, so that N, Cl, H are removed from a film, and by making O coupled with Si having excess bonding hands, the thin film formed on the nitride film and the nitride film are changed into the oxide film.

According to still another aspect of the present invention, there are provided a first step of forming a thin film on a substrate by supplying source gas to a substrate; a second step of changing the thin film into a nitride film by activating gas containing nitrogen by plasma or heat and supplying this gas to the thin film; a third step of forming the thin film on the nitride film by supplying the source gas to the nitride film; and a fourth step of changing the thin film formed on the nitride film and the nitride film into an oxynitride film by activating gas containing oxygen by heat and supplying this gas to the thin film formed on the nitride film, with this cycle set as one cycle and performed for at least one or more times.

Preferably, the thin film is a silicon film, and in the fourth step, at least any one of Si—N, Si—Cl, Si—H bonds contained in the nitride film is excited to decouple this bond, so that N, Cl, H are removed from a film, and by making O coupled with Si having excess bonding hands, the thin film formed on the nitride film and the nitride film are changed into the oxynitride film.

According to still another aspect of the present invention, there is provided a substrate processing apparatus including:
a processing container configured to process a substrate;
a source gas supply tube configured to supply source gas into the processing container;
a nitrogen-containing gas supply tube configured to supply gas containing nitrogen into the processing container;
an oxygen-containing gas supply tube configured to supply gas containing oxygen into the processing container;
a plasma unit configured to activate the gas containing nitrogen or the gas containing oxygen by plasma;
a heater configured to heat inside of the processing container; and
a controller configured to perform control, so that a thin film is formed on a substrate by supplying the source gas into the processing container, then the thin film is changed into a nitride film by activating gas containing nitrogen by plasma or heat by the heater and supplying this gas into the processing container, and the nitride film is changed into an oxide film by activating gas containing oxygen by plasma and supplying this gas into the processing container, with this cycle set as one cycle and performed for at least one or more times.

According to still another aspect of the present invention, there is provided a substrate processing apparatus including:
a processing container configured to process a substrate;
a source gas supply tube configured to supply source gas into the processing container;
a nitrogen-containing gas supply tube configured to supply gas containing nitrogen into the processing container;
an oxygen-containing gas supply tube configured to supply gas containing oxygen into the processing container;
a plasma unit configured to activate the gas containing nitrogen or the gas containing oxygen by plasma;
a heater configured to heat inside of the processing container; and
a controller configured to perform control, so that a thin film is formed on a substrate by supplying source gas into the processing container, then the thin film is changed into a nitride film by activating gas containing nitrogen by plasma or heat by the heater and supplying this gas into the processing container, the thin film is formed on the nitride film by supplying source gas into the processing container; and the thin film formed on the nitride film and the nitride film are changed into an oxide film by activating gas containing oxygen by plasma and supplying this gas into the processing container, with this cycle set as one cycle and performed for at least one or more times.

According to still another aspect of the present invention, there is provided a substrate processing apparatus including:
a processing container configured to process a substrate;
a source gas supply tube configured to supply source gas into the processing container;
a nitrogen-containing gas supply tube configured to supply gas containing nitrogen into the processing container;
an oxygen-containing gas supply tube configured to supply gas containing oxygen into the processing container;
a plasma source configured to activate the gas containing nitrogen or the gas containing oxygen by plasma;
a heater configured to heat inside of the processing container; and
a controller configured to perform control, so that a thin film is formed on a substrate by supplying source gas into the processing container, then the thin film is changed into a nitride film by activating gas containing nitrogen by plasma or heat by the heater and supplying this gas into the processing container, and the nitride film is changed into an oxynitride film by activating gas containing oxygen by heat and supplying this gas into the processing container, with this cycle set as one cycle and performed for at least one or more times.

According to still another aspect of the present invention; there is provided a substrate processing apparatus including:
a processing container configured to process a substrate;
a source gas supply tube configured to supply source gas into the processing container;
a nitrogen-containing gas supply tube configured to supply gas containing nitrogen into the processing container;
an oxygen-containing gas supply tube configured to supply gas containing oxygen into the processing container;
a plasma source configured to activate the gas containing nitrogen or the gas containing oxygen by plasma;
a heater configured to heat inside of the processing container; and
a controller configured to perform control, so that a thin film is formed on a substrate by supplying source gas into the processing container, then the thin film is changed into a nitride film by activating gas containing nitrogen by plasma or heat by the heater and supplying this gas into the processing container, and the thin film is formed on the nitride film by supplying source gas into the processing container, then the thin film formed on the nitride film and the nitride film are changed into an oxynitride film by activating gas containing oxygen by heat and supplying this gas into the processing container, with this cycle set as one cycle and performed for at least one or more times.

What is claimed is:

1. A method for manufacturing a semiconductor device, comprising:
forming a specific element-containing layer containing at least one element selected from the group consisting of chlorine and carbon on a substrate by supplying source gas containing a specific element and the at least one element selected from the group consisting of chlorine and carbon to the substrate in a processing container;
changing the specific element-containing layer into a nitride layer containing the at least one element selected from the group consisting of chlorine and carbon, by supplying activated gas containing nitrogen to the substrate in the processing container; and
changing the nitride layer into an oxide layer or an oxynitride layer having a lower concentration of the at least one element selected from the group consisting of chlorine and carbon than the concentration in the nitride layer, by supplying activated gas containing oxygen to the substrate in the processing container,
wherein this cycle is set as one cycle and this cycle is repeated for multiple number of times, to form an oxide film or an oxynitride film of a prescribed thickness on the substrate.

2. The method according to claim 1, wherein the nitride layer is changed into the oxide layer by activating the gas containing oxygen by plasma and supplying this gas to the substrate in the processing container, in changing the nitride layer into the oxide layer or the oxynitride layer.

3. The method according to claim 1, wherein the nitride layer is changed into the oxynitride layer by activating the gas containing oxygen by heat and supplying this gas to the substrate in the processing container, in changing the nitride layer into the oxide layer or the oxynitride layer.

4. A method for manufacturing a semiconductor device, comprising:
forming a silicon-containing layer containing at least one element selected from the group consisting of chlorine and carbon on a substrate by supplying source gas containing silicon and the at least one element selected from the group consisting of chlorine and carbon to the substrate in a processing container;
changing the silicon-containing layer into a silicon nitride layer containing the at least one element selected from the group consisting of chlorine and carbon, by supplying activated gas containing nitrogen to the substrate in the processing container; and
changing the silicon nitride layer into a silicon oxide layer or a silicon oxynitride layer having a lower concentration of the at least one element selected from the group consisting of chlorine and carbon than the concentration in the nitride layer, by supplying activated gas containing oxygen to the substrate in the processing container,
wherein this cycle is set as one cycle and this cycle is repeated for multiple number of times, to form an oxide film or an oxynitride film of a prescribed thickness on the substrate.

5. A substrate processing apparatus comprising:
a processing container configured to accommodate a substrate;
a source gas supply system configured to supply source gas containing a specific element and at least one element selected from the group consisting of chlorine and carbon into the processing container;
a nitrogen-containing gas supply system configured to supply gas containing nitrogen into the processing container;
an oxygen-containing gas supply system configured to supply gas containing oxygen into the processing container;
an activating mechanism configured to activate the gas containing nitrogen and the gas containing oxygen; and
a controller configured to control the source gas supply system, the nitrogen-containing gas supply system, the oxygen-containing gas supply system, and the activating mechanism, so that a specific element-containing layer containing the at least one element selected from the group consisting of chlorine and carbon is formed on the substrate by supplying the source gas to the substrate in the processing container, then the specific element-containing layer is changed into a nitride layer containing the at least one element selected from the group consisting of chlorine and carbon, by supplying activated gas containing nitrogen to the substrate in the processing container, and the nitride layer is changed into an oxide layer or an oxynitride layer having a lower concentration of the at least one element selected from the group consisting of chlorine and carbon, by supplying activated gas containing oxygen to the substrate in the processing container, wherein this cycle is set as one cycle and this cycle is repeated for multiple number of times, to form an oxide film or an oxynitride film of a prescribed thickness on the substrate.

6. The method according to claim 1, wherein the specific element-containing layer is an adsorption layer of the source gas or a layer of the specific element.

7. The method according to claim 1, wherein a temperature of the substrate is maintained to a similar temperature, in forming the specific element-containing layer, in changing the specific element-containing layer into the nitride layer, and in changing the nitride layer into the oxide layer or the oxynitride layer.

8. The method according to claim 4, wherein in changing the silicon nitride layer into the silicon oxide layer or the silicon oxynitride layer, the silicon nitride layer is changed into the silicon oxide layer by activating the gas containing oxygen by plasma and supplying this gas to the substrate in the processing container.

9. The method according to claim 4, wherein in changing the silicon nitride layer into the silicon oxide layer or the silicon oxynitride layer, the silicon nitride layer is changed into the silicon oxynitride layer by activating the gas containing oxygen by heat and supplying this gas to the substrate in the processing container.

10. The method according to claim 4, wherein the silicon-containing layer is an adsorption layer of the source gas or a silicon layer.

11. The method according to claim 4, wherein a temperature of the substrate is maintained to a similar temperature, in forming the silicon-containing layer, in changing the silicon-containing layer into the silicon nitride layer, and in changing the silicon nitride layer into the silicon oxide layer or the silicon oxynitride layer.

12. A method for processing a substrate, comprising:
forming a specific element-containing layer containing at least one element selected from the group consisting of chlorine and carbon on a substrate by supplying source gas containing a specific element and the at least one element selected from the group consisting of chlorine and carbon to the substrate in a processing, container;
changing the specific element-containing layer into a nitride layer containing the at least one element selected from the group consisting of chlorine and carbon, by supplying activated gas containing nitrogen to the substrate in the processing container; and
changing the nitride layer into an oxide layer or an oxynitride layer having a lower concentration of the at least one element selected from the group consisting of chlorine and carbon than the concentration in the nitride layer, by supplying activated gas containing oxygen to the substrate in the processing container,
wherein this cycle is set as one cycle and this cycle is repeated for multiple number of times, to form an oxide film or an oxynitride film of a prescribed thickness on the substrate.

13. The method according to claim 1, wherein the source gas contains at least one selected from the group consisting of chlorosilane and aminosilane.

14. The method according to claim 1, wherein the source gas contains chlorosilane.

15. The method according to claim 1, wherein the source gas contains at least one selected from the group consisting of $Si_2Cl_6$, $SiCl_4$ and $SiH_2Cl_2$.

16. The method according to claim 1, wherein the source gas contains aminosilane.

17. The method according to claim 1, wherein the source gas contains at least one selected from the group consisting of $Si(N(CH_3)_2)_4$, $Si(N(CH_3)_2)_3H$, $Si(N(C_2H_5)_2)_2H_2$, and $SiH_2(NH(C_4H_9))_2$.

18. A method for manufacturing a semiconductor device, comprising:
   forming a specific element-containing layer containing chlorine on a substrate by supplying source gas containing a specific element and chlorine to the substrate in a processing container;
   changing the specific element-containing layer into a nitride layer containing chlorine, by supplying activated gas containing nitrogen to the substrate in the processing container; and
   changing the nitride layer into an oxide layer or an oxynitride layer having a lower concentration of chlorine than the concentration in the nitride layer, by supplying activated gas containing oxygen to the substrate in the processing container;
   wherein this cycle is set as one cycle and this cycle is repeated for multiple number of times, to form an oxide film or an oxynitride film of a prescribed thickness on the substrate.

19. A method for manufacturing a semiconductor device, comprising:
   forming a specific element-containing layer containing carbon on a substrate by supplying source gas containing a specific element and carbon to the substrate in a processing container;
   changing the specific element-containing layer into a nitride layer containing carbon, by supplying activated gas containing nitrogen to the substrate in the processing container; and
   changing the nitride layer into an oxide layer or an oxynitride layer having a lower concentration of carbon than the concentration in the nitride layer, by supplying activated gas containing oxygen to the substrate in the processing container;
   wherein this cycle is set as one cycle and this cycle is repeated for multiple number of times, to form an oxide film or an oxynitride film of a prescribed thickness on the substrate.

20. The method according to claim 1, wherein the source gas contains $Si_2Cl_6$.

21. The method according to claim 1, wherein:
   the source gas is supplied from a first supply part, in forming the specific element-containing layer on the substrate;
   the gas containing nitrogen is supplied from a second supply part, in changing the specific element-containing layer into the nitride layer; and
   the gas containing oxygen is supplied from the second supply part, in changing the nitride layer into the oxide layer or the oxynitride layer.

22. The method according to claim 21, wherein:
   a plurality of substrates are arranged so as to be stacked in the processing container;
   the first supply part is provided at a portion extending from a lower part to an upper part of an inner wall of the processing container, along a stacking direction of the plurality of substrates; and
   the second supply part is provided at the portion extending from the lower part to the upper part of the inner wall of the processing container, along the stacking direction of the substrates.

23. The method according to claim 22, wherein:
   a plurality of first supply holes for supplying the source gas are provided on the first supply part so as to extend from the lower part to the upper part of the processing container; and
   a plurality of second supply holes for supplying the gas containing nitrogen or the gas containing oxygen are provided on the second supply part so as to extend from the lower part to the upper part of the processing container.

24. The method according to claim 22, wherein electrodes for generating plasma are provided at a portion extending from the lower part to the upper part of the processing container, along the stacking direction of the plurality of substrates, in the second supply part.

* * * * *